(12) United States Patent
Shin et al.

(10) Patent No.: US 10,976,873 B2
(45) Date of Patent: Apr. 13, 2021

(54) DISPLAY DEVICE

(71) Applicant: Samsung Display Co., Ltd., Yongin-si (KR)

(72) Inventors: Jaiku Shin, Hwaseong-si (KR); Jiwon Han, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/712,906

(22) Filed: Dec. 12, 2019

(65) Prior Publication Data

US 2020/0209998 A1 Jul. 2, 2020

(30) Foreign Application Priority Data

Jan. 2, 2019 (KR) .................. 10-2019-0000416

(51) Int. Cl.
| | | |
|---|---|---|
| *G06F 3/044* | (2006.01) | |
| *G09G 3/3233* | (2016.01) | |
| *G09G 3/3266* | (2016.01) | |
| *G09G 3/3275* | (2016.01) | |
| *H01L 27/32* | (2006.01) | |

(52) U.S. Cl.
CPC .... *G06F 3/044* (2013.01); *G06F 2203/04102* (2013.01); *G09G 3/3233* (2013.01); *G09G 3/3266* (2013.01); *G09G 3/3275* (2013.01); *H01L 27/3244* (2013.01); *H01L 2251/5338* (2013.01)

(58) Field of Classification Search
CPC ........... G06F 3/044; G06F 2203/04102; G06F 1/1643; G06F 1/1641; G06F 3/046; G09G 3/3233; G09G 3/3275; G09G 3/3266; H01L 2251/5338; H01L 27/3244; H04M 1/0268; H04M 1/0214; H04M 1/0216
See application file for complete search history.

(56) References Cited

U.S. PATENT DOCUMENTS

| | | | | |
|---|---|---|---|---|
| 9,204,565 B1 * | 12/2015 | Lee | .................. | E05D 3/022 |
| 9,980,373 B2 * | 5/2018 | Jeong | ................... | G05B 11/01 |
| 10,143,098 B1 | 11/2018 | Lee | | |
| 10,545,538 B2 * | 1/2020 | Jia | ..................... | H04M 1/0268 |
| 10,694,623 B2 * | 6/2020 | Park | ................... | H05K 5/0017 |
| 10,754,395 B2 * | 8/2020 | Sanchez | ............... | H05K 5/0226 |
| 2012/0169642 A1 | 7/2012 | Lee | | |

(Continued)

FOREIGN PATENT DOCUMENTS

| | | |
|---|---|---|
| EP | 3 419 071 A1 | 12/2018 |
| KR | 10-2015-0051054 A | 5/2015 |

(Continued)

*Primary Examiner* — Muhammad N Edun
(74) *Attorney, Agent, or Firm* — Lewis Roca Rothgerber Christie LLP

(57) ABSTRACT

A display device includes a display module, a first supporter under the display module, a second supporter under the display module, the first and second supporters being arranged in a first direction with a space therebetween, and a digitizer module under the first and second supporters and including a first opening extending in a second direction crossing the first direction and second openings respectively extending along the first direction from both ends of the first opening. The first opening overlaps with the space between the first supporter and the second supporter.

29 Claims, 16 Drawing Sheets

(56) References Cited

U.S. PATENT DOCUMENTS

2015/0123860 A1    5/2015   Park et al.
2017/0061836 A1*   3/2017   Kim ..................... G06F 1/1652
2018/0070460 A1*   3/2018   Han ..................... G06F 1/1626
2018/0188874 A1    7/2018   Cho et al.
2018/0335679 A1   11/2018   Hashimoto et al.

FOREIGN PATENT DOCUMENTS

| KR | 10-2016-0083318 A | 7/2016 |
| KR | 10-2016-0150070 A | 12/2016 |
| KR | 10-1750564 B1 | 6/2017 |
| KR | 10-2018-0027467 A | 3/2018 |

* cited by examiner

DISPLAY DEVICE

CROSS-REFERENCE TO RELATED APPLICATION

This application claims priority to and the benefit of Korean Patent Application No. 10-2019-0000416, filed on Jan. 2, 2019, the entire content of which is hereby incorporated by reference.

BACKGROUND

1. Field

One or more aspects of embodiments of the present disclosure are directed toward a display device, more particularly, toward a display device having a digitizer module.

2. Description of the Related Art

In general, electronic devices that provide a user with an image, such as a smart phone, a digital camera, a notebook computer, a navigation unit, and/or a smart television, include a display device to display the image. The display device generates the image and provides the image to the user through a display screen thereof.

In recent years, with the technological development for the display device, various display devices have been developed. For example, a flexible display device that is foldable and/or rollable is being developed. The flexible display device, which is capable of being transformed into various shapes, is easy to carry and improves a user's convenience.

A foldable display device may be folded with respect to a folding axis. However, when the foldable display device is folded, various elements may be damaged in the folded portion that is deformed from a flat state to a curved state.

SUMMARY

One or more aspects of embodiments of the present disclosure are directed toward a display device capable of preventing or protecting a digitizer from being damaged when being folded, and preventing or protecting a display quality from degrading due to a line pattern of the digitizer.

Embodiments of the inventive concept provide a display device including a display module, a first supporter under the display module, a second supporter under the display module, the first and second supporters being arranged with each other in a first direction with a space therebetween, and a digitizer module under the first and second supporters and having a first opening defined therethrough and extending in a second direction crossing the first direction and second openings defined therethrough and respectively extending along the first direction from both ends of the first opening. The first opening overlaps the space between the first supporter and the second supporter.

Embodiments of the inventive concept provide a display device including a display module, a first supporter under the display module, a second supporter under the display module, the first and second supporters being arranged with each other in a first direction with a space therebetween, and a digitizer module under the first and second supporters and having a first opening defined therethrough, the first opening extending in a second direction crossing the first direction and overlapping the space between the first supporter and the second supporter. The digitizer module includes a first portion under the first supporter and a second portion under the second supporter, the first and second portions defining the first opening. A distance in the first direction between the first portion and the second portion is smaller than a distance in the first direction between the first supporter and the second supporter.

Embodiments of the inventive concept provide a display device including a display module including non-folding areas arranged with each other in a first direction and a folding area between the non-folding areas, and a digitizer module under the display module and including a first opening defined therethrough and extending in a second direction crossing the first direction and second openings defined therethrough and respectively extending along the first direction from both ends of the first opening. The first opening overlaps the folding area.

According to the above, since the portion of the digitizer module, which overlaps with the folding area, is maintained in the flat state without being deformed in the curved shape when the display device is folded, the digitizer module may be prevented or protected from being damaged due to the folding operation.

In addition, the digitizer module is disposed under the supporter, and thus the display quality may be prevented or protected from degrading due to the curved surface of the digitizer module.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
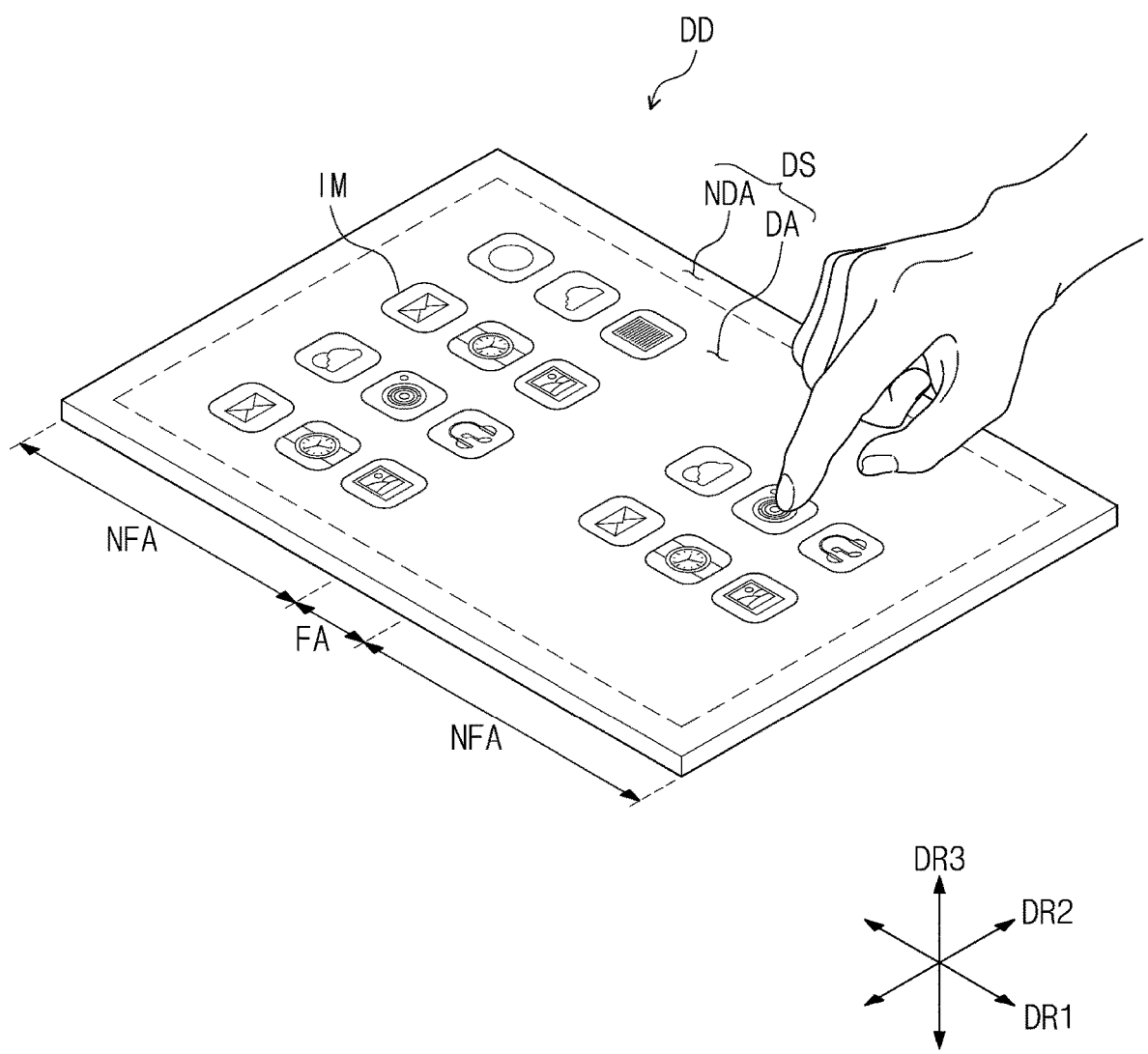
FIG. 1 is a perspective view showing a display device according to an example embodiment of the present disclosure.

It will be understood that when an element or layer is referred to as being "on", "connected to" or "coupled to" another element and/or layer, it can be directly on, connected or coupled to the other element and/or layer or intervening elements and/or layers may be present. In contrast, when an element or layer is referred to as being "directly on," "directly connected to," or "directly coupled to" another element and/or layer, there are no intervening elements present.

Like numerals refer to like elements throughout. In the drawings, the thickness, ratio, and dimension of components may be exaggerated for effective description of the technical content.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes", "comprises," "comprising," and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be explained in more detail with reference to the accompanying drawings.

Figure 2:
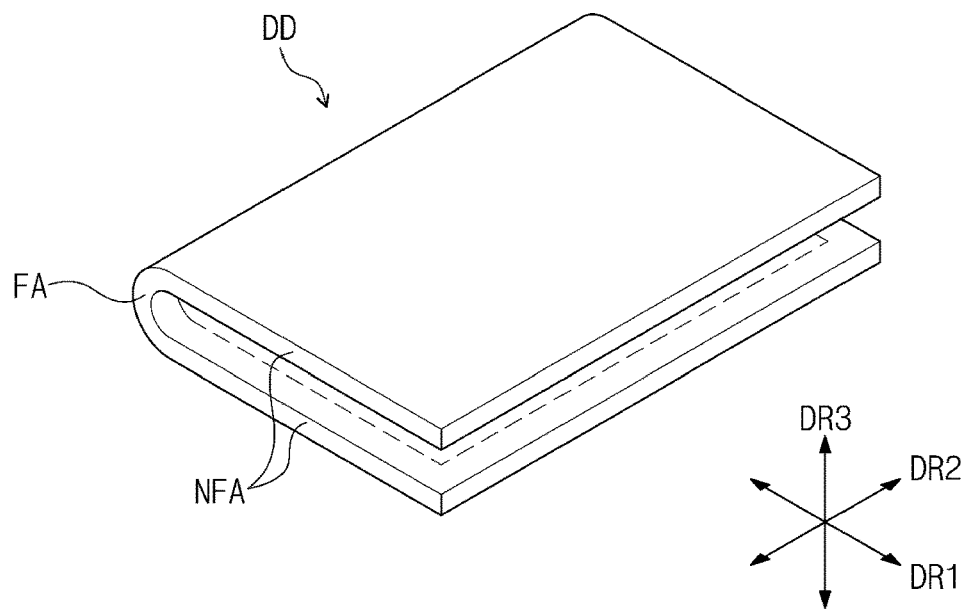
FIG. 2 is a view showing a folding state of the display device shown in FIG. 1.

FIG. 1 is a perspective view showing a display device DD according to an example embodiment of the present disclosure. FIG. 2 is a view showing a folding state of the display device DD shown in FIG. 1.

Referring to FIG. 1, the display device DD according to the example embodiment of the present disclosure may have a rectangular shape defined by long sides extending in a first direction DR1 and short sides extending in a second direction DR2 crossing the first direction DR1, however, the shape of the display device DD should not be limited to the rectangular shape and may have various suitable shapes.

Hereinafter, a direction normal (e.g., substantially perpendicular) to a surface (a plane) defined by the first direction DR1 and the second direction DR2 may be referred to as a "third direction DR3".

The display device DD may include a folding area FA and a plurality of non-folding areas NFA. The folding area FA may be disposed (e.g., located) between the non-folding areas NFA, and the folding area FA and the non-folding areas NFA may be arranged in the first direction DR1.

In the present example embodiment, one folding area FA and two non-folding areas NFA are shown as a representative example, however, the number of folding areas FA and the number of non-folding areas NFA should not be limited thereto or thereby. For example, a display module DM of the display device DD may include more than two non-folding areas NFA and a plurality of folding areas FA disposed between the respective non-folding area NFA.

An upper surface of the display module DM may be referred to as a "display surface DS" and may be a plane surface defined by the first direction DR1 and the second direction DR2. Images IM generated by the display device DD may be provided to a user through the display surface DS.

The display surface DS may include a display area DA and a non-display area NDA around the display area DA. The display area DA displays the image, and the non-display area NDA does not display the image. The non-display area NDA surrounds the display area DA and defines an edge of the display device DD, which is printed by (provided in) a predetermined or set color.

Referring to FIG. 2, the display device DD may be, but is not limited to, a flexible display device DD. For example, the display device DD may be a foldable display device DD that is folded or unfolded. The folding area FA may be folded, and thus the display device DD may be folded. The display device DD may be inwardly folded (in-folding) such that the display surface DS is not exposed to the outside.

Figure 3:
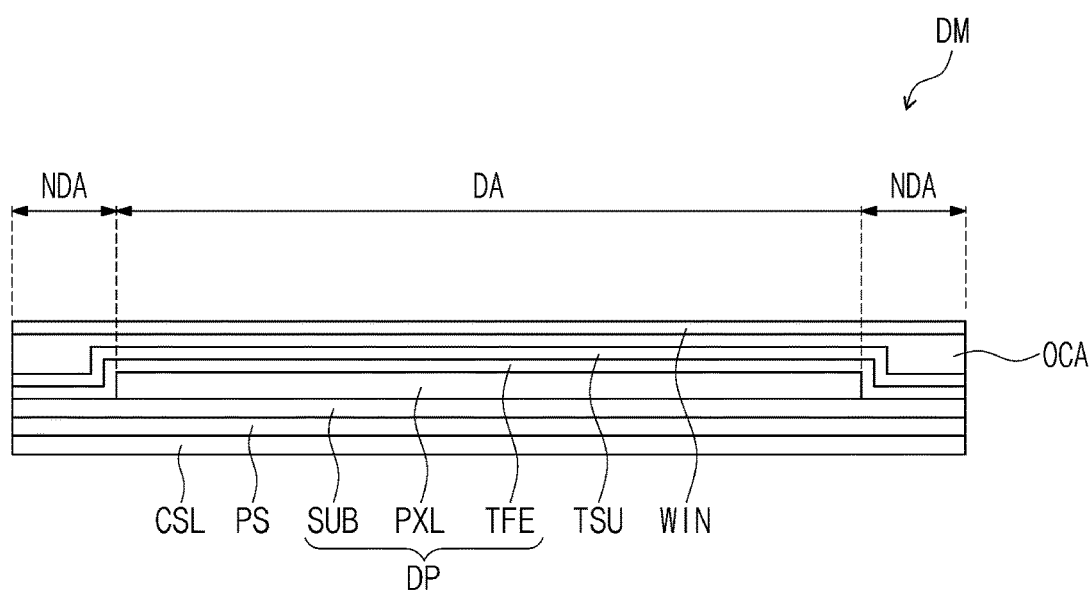
FIG. 3 is a cross-sectional view showing a cross section of a display module according to an example embodiment of the present disclosure.

FIG. 3 is a cross-sectional view showing a cross section of a display module DM according to an example embodiment of the present disclosure.

Referring to FIG. 3, the display module DM may include a display panel DP, a touch sensing unit TSU disposed on the display panel DP, a window WIN disposed on the touch sensing unit TSU, an adhesive OCA disposed between the touch sensing unit TSU and the window WIN, a protective substrate PS disposed under the display panel DP, and a cushion layer CSL disposed under the protective substrate PS.

The display panel DP may be an organic light emitting display panel, however, it should not be limited thereto or thereby. Various suitable display panels displaying the image, such as, for example, a liquid crystal display panel, an electrowetting display panel, and/or an electrophoretic display panel, may be used as the display panel DP.

The display panel DP may include a substrate SUB, a pixel layer PXL disposed on the substrate SUB, a thin film encapsulation layer TFE disposed on the substrate SUB to cover the pixel layer PXL. The substrate SUB may be a transparent substrate, for example, a flexible plastic substrate. For example, the substrate SUB may include a polyimide (PI).

The substrate SUB may include a display area DA and a non-display area NDA around the display area DA as the display module DM. The pixel layer PXL may be disposed on the display area DA. The pixel layer PXL may include a plurality of pixels, and each of the pixels PXL may include a light emitting element.

The thin film encapsulation layer TFE may include at least two inorganic layers and an organic layer disposed between the inorganic layers. The inorganic layers may include an inorganic material and may protect the pixel layer PXL from moisture and oxygen. The organic layer may include an organic material and may protect the pixel layer PXL from a foreign substance such as dust particles.

The touch sensing unit TSU may sense an external input by a user's finger and/or a touch pen, may convert the sensed input into a predetermined (or set) input signal, and may provide the display panel DP with the input signal. The touch sensing unit TSU may include a plurality of touch sensor units to sense the external input. The touch sensor units may sense the external input by a capacitive method. The display panel DP may receive the input signal from the touch sensing unit TSU and may generate an image corresponding to the input signal.

The window WIN may protect the display panel DP and the touch sensing unit TSU from external scratches and impacts. The window WIN may be attached to the touch sensing unit TSU by the adhesive OCA. The adhesive OCA may include an optically clear adhesive, however, it should not be limited to the optically clear adhesive. For example, a pressure sensitive adhesive may be used as the adhesive OCA. The image generated by the display panel DP may be provided to the user after passing through the window WIN.

The protective substrate PS may protect a lower portion of the display panel DP. The protective substrate PS may include a flexible plastic substrate. As an example, the protective substrate PS may include polyethylene terephthalate (PET).

The cushion layer CSL may absorb external impacts applied to the lower portion of the display module DM, to protect the display module DM. The cushion layer CSL may include a foam sheet having a predetermined (or set) elasticity.

In one or more embodiments, an adhesive may be disposed between the display panel DP and the protective substrate PS, to attach the protective substrate PS to the display panel DP. In some embodiments, an adhesive may be disposed between the protective substrate PS and the cushion layer CSL, to attach the cushion layer CSL to the protective substrate PS. The pressure sensitive adhesive may be used as any of the above-described adhesives.

Figure 4:
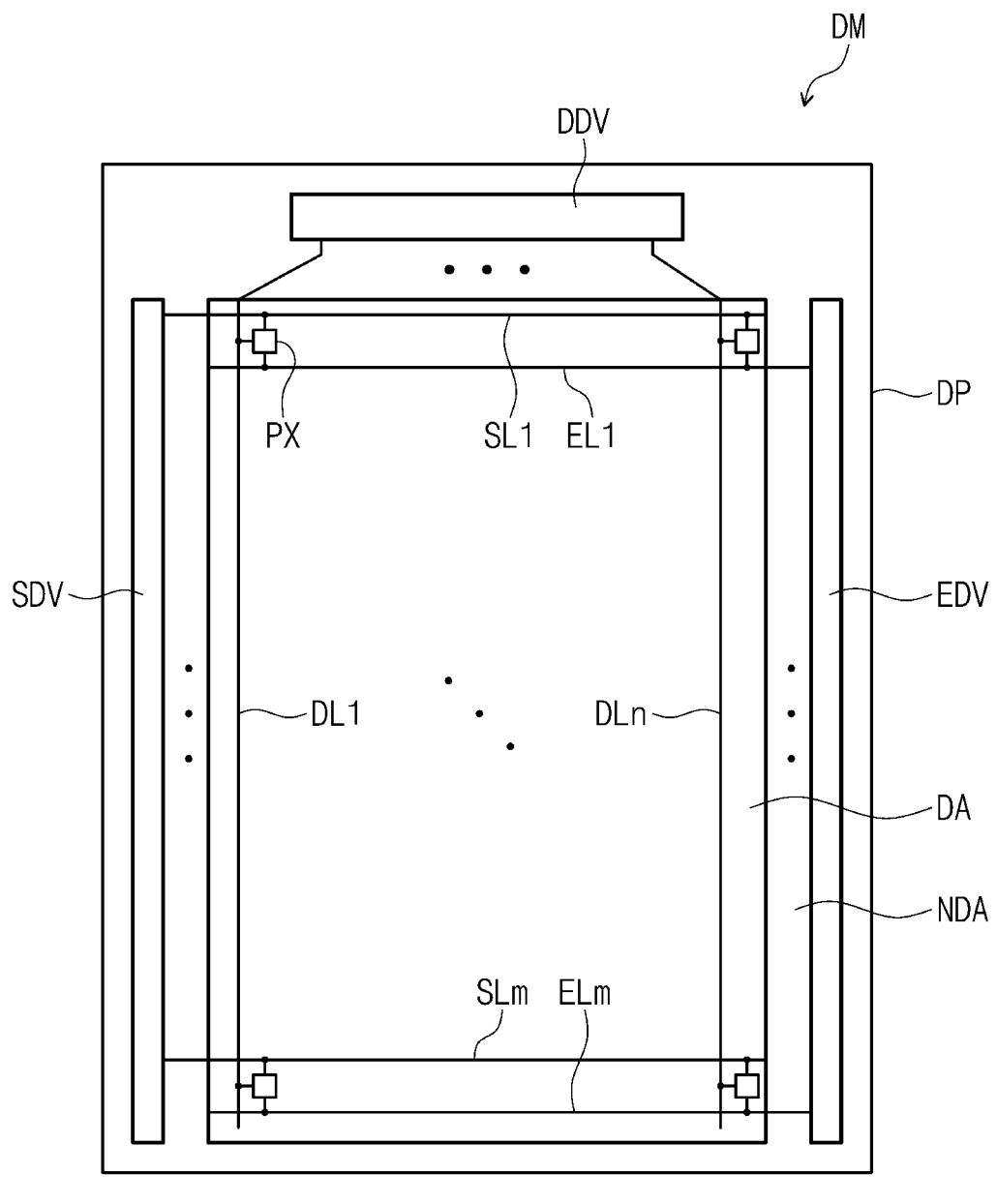
FIG. 4 is a plan view showing the display module shown in FIG. 3.

FIG. 4 is a plan view showing the display module DM shown in FIG. 3

Referring to FIG. 4, the display module DM according to the example embodiment of the present disclosure may include a display panel DP, a scan driver SDV, a data driver DDV, and a light emitting driver EDV.

The display panel DP may be a flexible display panel. For example, the display panel DP may include a plurality of electronic elements disposed on a flexible substrate. The display panel DP may have a rectangular shape defined by long sides extending in the first direction DR1 and short sides extending in the second direction DR2.

The display panel DP may include a plane surface defined by the first and second directions DR1 and DR2. The display panel DP may include, as the display surface DS of the display device DD, a display area DA and a non-display area NDA surrounding the display area DA.

The display panel DP may include a plurality of pixels PX, a plurality of scan lines SL1 to SLm, a plurality of data lines DL1 to DLn, and a plurality of light emitting lines EL1 to ELm. Each of "m" and "n" is a natural number. The pixels PX may be arranged in a matrix form, however, they should not be limited thereto or thereby. The pixels PX may be arranged in the display area DA and may be connected to the scan lines SL1 to SLm, the data lines DL1 to DLn, and the light emitting lines EL1 to ELm.

The scan driver SDV, the data driver DDV, and the light emitting driver EDV may be arranged in the non-display area NDA. The scan driver SDV may be disposed in the non-display area NDA adjacent to one side of the display panel DP, for example, a first long side of the long sides of the display panel DP.

The light emitting driver EDV may be disposed in the non-display area NDA adjacent to the other side of the display panel DP, for example, a second long side of the display panel DP opposite the first long side. The data driver DDV may be manufactured in an integrated circuit chip form and may be disposed in the non-display area NDA adjacent to one short side of the short sides of the display panel DP (e.g., a first short side).

The scan lines SL1 to SLm may extend in the second direction DR2 and may be connected to the scan driver SDV. The data lines DL1 to DLn may extend in the first direction DR1 and may be connected to the data driver DDV. The light emitting lines EL1 to ELm may extend in the second direction DR2 and may be connected to the light emitting driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages, and the data voltages may be applied to the pixels PX through the data lines DL1 to DLn. The light emitting driver EDV may generate a plurality of light emitting signals, and the light emitting signals may be applied to the pixels PX through the light emitting lines EL1 to ELm.

In some embodiments, the display module DM may include a timing controller to control an operation of the scan driver SDV, the data driver DDV, and the light emitting driver EDV.

The timing controller may generate a scan control signal, a data control signal, and a light emitting control signal in response to control signals applied thereto from the outside. The timing controller may receive image signals from the outside, may convert a data format of the image signals according to an interface with the data driver DDV, and may provide the converted image signals to the data driver DDV.

The scan driver SDV may generate the scan signals in response to the scan control signal, and the light emitting driver EDV may generate the light emitting signals in response to the light emitting control signal. The data driver DDV may receive the image signals whose data format is converted and may generate data voltages corresponding to the image signals in response to the data control signal.

The pixels PX may receive the data voltages in response to the scan signals. The pixels PX may emit light having brightness corresponding to the data voltages in response to the light emitting signals to display the image. A light emitting time of the pixels PX may be controlled by the light emitting signals.

Figure 5:
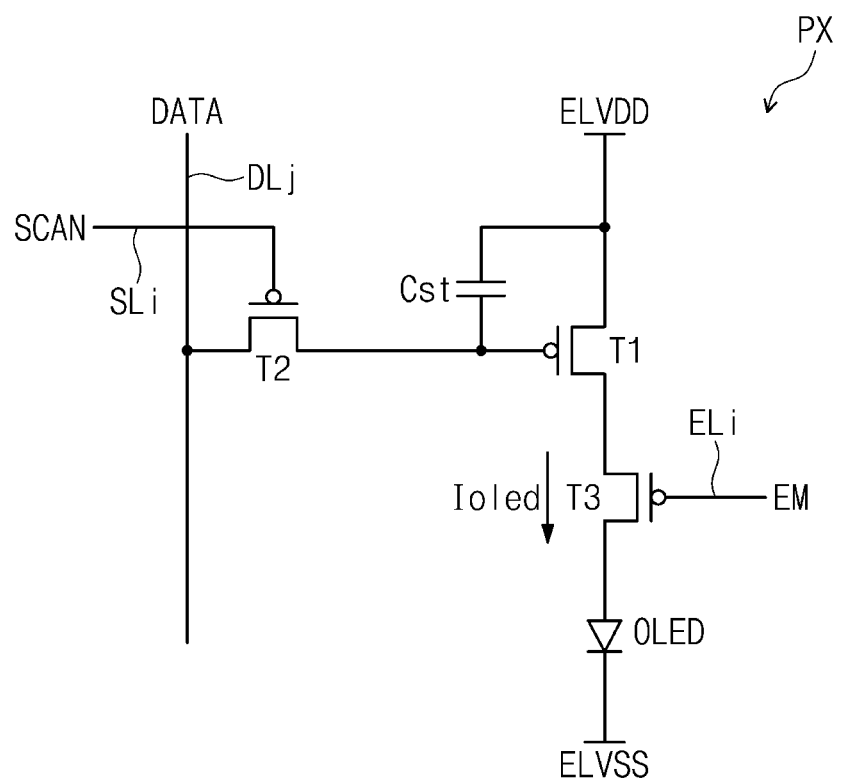
FIG. 5 is an equivalent circuit diagram showing a pixel shown in FIG. 4.

FIG. 5 is an equivalent circuit diagram showing the pixel PX shown in FIG. 4.

FIG. 5 shows the equivalent circuit diagram of one pixel PX as a representative example, however, other pixels PX shown in FIG. 4 may have the same equivalent circuit diagram as the pixel shown in FIG. 5.

Referring to FIG. 5, the pixel PX may be connected to a corresponding scan line SLi among the scan lines SL1 to SLm, a corresponding data line DLj among the data lines DL1 to DLn, and a corresponding light emitting line ELi among the light emitting lines EL1 to ELm. The "i" is a natural number equal to or smaller than the "m", and the "j" is a natural number equal to or smaller than the "n".

The pixel PX may include a light emitting element OLED, a driving transistor T1, a capacitor Cst, a switching transistor T2, and a light emitting control transistor T3. The light emitting element OLED may be an organic light emitting diode.

The driving transistor T1 may include a source terminal that receives a first voltage ELVDD and a drain terminal connected to a source terminal of the light emitting control transistor T3. The driving transistor T1 may include a gate terminal connected to a drain terminal of the switching transistor T2.

The switching transistor T2 may include a gate terminal connected to the scan line SLi and a source terminal connected to the data line DLj. The capacitor Cst may include a first electrode connected to the source terminal of the driving transistor T1 and a second electrode connected to the gate terminal of the driving transistor T1.

The light emitting control transistor T3 may include a gate terminal connected to the light emitting line ELi and a drain terminal connected to an anode electrode of the light emitting element OLED. The light emitting element OLED may include a cathode electrode that receives a second voltage ELVSS, and the second voltage ELVSS may have a level lower than that of the first voltage ELVDD.

The switching transistor T2 may be turned on in response to a scan signal SCAN applied thereto through the scan line SLi. The turned-on switching transistor T2 may provide the data voltage DATA provided thereto through the data line DLj to the gate terminal of the driving transistor T1.

The capacitor Cst is charged with the data voltage DATA applied to the gate terminal of the driving transistor T1 and may maintain the charged voltage therein after the switching transistor T2 is turned off.

The light emitting control transistor T3 may be turned on in response to a light emitting signal EM applied to the gate terminal thereof through the light emitting line ELi. The turned-on light emitting control transistor T3 may provide a current load flowing through the driving transistor T1 to the light emitting element OLED. The pixel PX may emit the light during a time in which the light emitting signal EM is applied. The light emitting element OLED may emit the light with different intensity depending on an amount of the current load applied thereto.

FIG. 5 shows PMOS transistors as a representative example of the transistors T1 to T3 of the pixel PX, however, they should not be limited thereto or thereby. For example, the transistors T1 to T3 of the pixel PX may be implemented by NMOS transistors.

Figure 6:
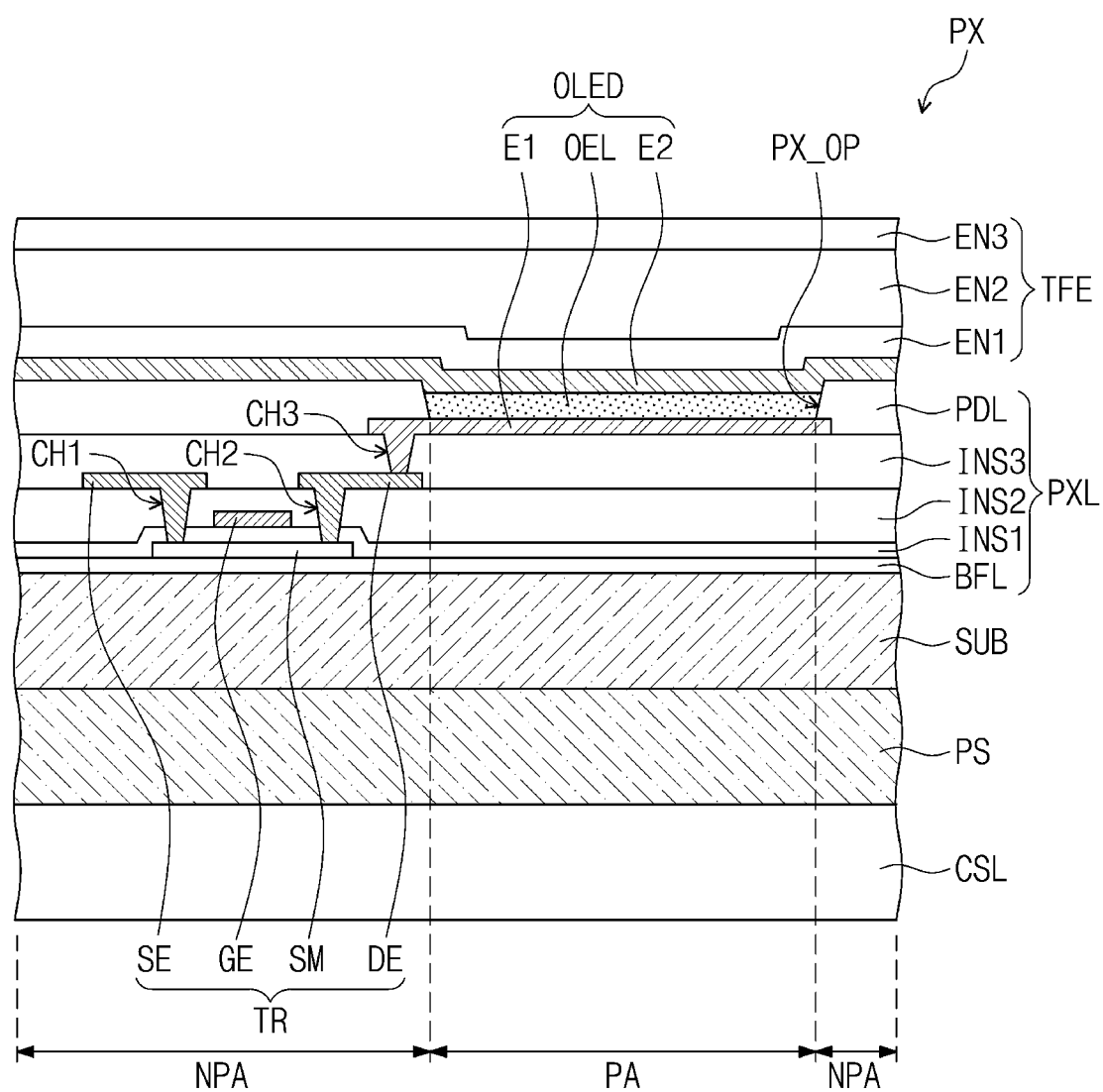
FIG. 6 is a cross-sectional view showing a cross section of the pixel shown in FIG. 5.

FIG. 6 is a cross-sectional view showing a cross section of the pixel PX shown in FIG. 5.

Referring to FIG. 6, the pixel PX may include the light emitting element OLED and the transistor TR connected to the light emitting element OLED. The light emitting element OLED may include a first electrode E1, a second electrode E2, and an organic light emitting layer OEL disposed between the first electrode E1 and the second electrode E2.

The pixel PX may be divided into a pixel area PA and a non-pixel area NPA around the pixel area PA. The light emitting element OLED may be disposed in the pixel area PA, and the transistor TR may be disposed in the non-pixel area NPA.

The transistor TR may be the light emitting control transistor T3. The transistor TR and the light emitting element OLED may both be disposed on the substrate SUB. A buffer layer BFL may also be disposed on the substrate SUB and may include an inorganic material.

A semiconductor layer SM of the transistor TR may be disposed on the buffer layer BFL. The semiconductor layer SM may include an inorganic semiconductor, such as, for example, amorphous silicon and/or polycrystalline silicon, and/or an organic semiconductor. In some embodiments, the semiconductor layer SM may include an oxide semiconductor. The semiconductor layer SM may include a source area, a drain area, and a channel area defined between the source area and the drain area.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 to overlap with the semiconductor layer SM. The gate electrode GE may be disposed to overlap with the channel area of the semiconductor layer SM.

A second insulating layer INS2 may be disposed on the first insulating layer INS1 to cover the gate electrode GE. The second insulating layer INS2 may be referred to as an "interlayer insulating layer". The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to the source area of the semiconductor layer SM through a first contact hole CH1 defined through the first insulating layer INS1 and the second insulating layer INS2. The drain electrode DE may be connected to the drain area of the semiconductor layer SM through a second contact hole CH2 defined through the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may be referred to as a "planarization layer" that provides a flat (or a substantially flat) upper surface and may include an organic material.

The first electrode E1 of the OLED may be disposed on the third insulating layer INS3. The first electrode E1 may be connected to the drain electrode DE of the transistor TR through a third contact hole CH3 defined in the third insulating layer INS3. The first electrode E1 may be referred to as a "pixel electrode" or "anode electrode". The first electrode E1 may include a transparent electrode and/or a reflective electrode.

A pixel definition layer PDL may be disposed on the first electrode E1 and the third insulating layer INS3 and may expose a predetermined (or set) portion of the first electrode E1. An opening PX_OP may be defined in the pixel definition layer PDL to expose the predetermined (or set) portion of the first electrode E1.

The organic light emitting layer OEL may be disposed on the first electrode E1 in the opening PX_OP. The organic light emitting layer OEL may generate a light having one of red, green, and blue colors, however, it should not be limited thereto or thereby. The organic light emitting layer OEL may generate a white light by a combination of organic materials respectively generating the red, green, and blue colors.

The second electrode E2 may be disposed on the pixel definition layer PDL and the organic light emitting layer OEL. The second electrode E2 may be referred to as a "common electrode" or "cathode electrode". The second electrode E2 may include a transparent electrode and/or a reflective electrode.

In a case where the display panel DP is a front surface light emitting type (or kind) (e.g., a front surface organic light emitting display panel), the first electrode E1 may be implemented by the reflective electrode, and the second electrode E2 may be implemented by the transparent electrode. In a case where the display panel DP is a rear surface light emitting type (or kind) (e.g., a rear surface organic light emitting display panel), the first electrode E1 may be implemented by the transparent electrode, and the second electrode E2 may be implemented by the reflective electrode. The first electrode E1 may be a positive electrode that serves as a hole injection electrode, and the second electrode E2 may be a negative electrode that serves as an electron injection electrode.

The thin film encapsulation layer TFE may be disposed on the light emitting element OLED to cover the pixel PX. The thin film encapsulation layer TFE may include a first encapsulation layer EN1 disposed on the light emitting element OLED, a second encapsulation layer EN2 disposed on the first encapsulation layer EN1, and a third encapsulation layer EN3 disposed on the second encapsulation layer EN2.

Each of the first and third encapsulation layers EN1 and EN3 may include an inorganic material, and the second encapsulation layer EN2 may include an organic material. The second encapsulation layer EN2 may have a thickness greater than a thickness of each of the first and third encapsulation layers EN1 and EN3. A layer (or a plurality of layers) disposed between the substrate SUB and the thin film encapsulation layer TFE may be referred to as the "pixel layer PXL".

The first voltage ELVDD may be applied to the first electrode E1, and the second voltage ELVSS may be applied to the second electrode E2. Holes and electrons injected into the organic light emitting layer OEL are recombined to generate excitons, and the light emitting element OLED emits the light generated by the excitons that return to a ground state from an excited state. The light emitting element OLED may emit red, green, and/or blue lights, in accordance with the current flow, so that the image may be displayed.

Figure 7:
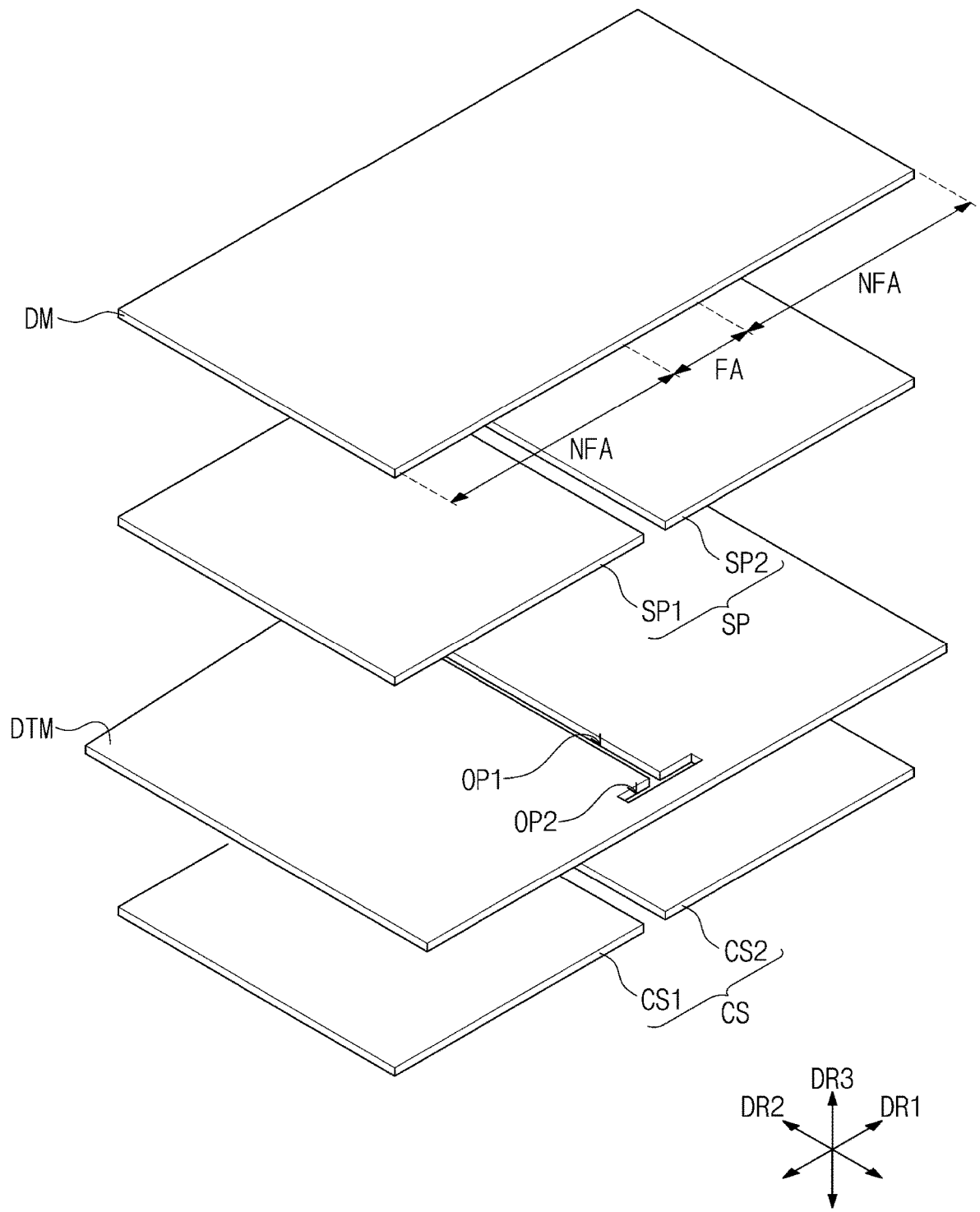
FIG. 7 is an exploded perspective view showing a display device according to an example embodiment of the present disclosure.

FIG. 7 is an exploded perspective view showing the display device according to an example embodiment of the present disclosure.

Referring to FIG. 7, the display device according to the example embodiment of the present disclosure may include the display module DM, a supporter SP disposed under the display module DM, a digitizer module DTM disposed under the supporter SP, and a case CS disposed under the digitizer module DTM.

The supporter SP may support the display module DM. The supporter SP may include a first supporter SP1 and a second supporter SP2, which are arranged in the first direction DR1. The first supporter SP1 and the second supporter SP2 may overlap (e.g., may align) with the non-folding areas NFA, respectively. The first supporter SP1 and the second supporter SP2 may be respectively disposed under the non-folding areas NFA to support the non-folding areas NFA.

The digitizer module DTM may be a device capable of receiving position information indicated by the user on the display surface. In some embodiments, the digitizer module DTM may be implemented in an electromagnetic manner (or electromagnetic resonance manner). As an example, the digitizer module DTM may include a digitizer sensor substrate including a plurality of coils.

When the user moves the pen on the display device, the pen may be driven by an alternating current signal to cause a vibrating magnetic field, and the vibrating magnetic field may induce a signal to the coils. A position of the pen may be detected through the signal induced in the coils. The digitizer module DTM may detect the position of the pen by detecting an electromagnetic change caused by the approach of the pen. Accordingly, the digitizer module DTM may not be necessarily required to be disposed on a front surface of the display module DM, and the digitizer module DTM may be disposed on a rear surface of the display module DM.

A first opening OP1 extending in the second direction DR2 and a second opening OP2 extending in the first direction DR1 may be defined in the digitizer module DTM. The structure of the digitizer module DTM will be described in more detail with reference to FIG. 8.

The case CS may support the digitizer module DTM. In some embodiments, a hinge may be connected to the case CS. The case CS may rotate with respect to a folding axis provided by the hinge to fold the display device DD. For the convenience of explanation, FIG. 7 shows a flat portion of the case CS, however, the case CS may also include a sidewall portion extending from an edge of the flat portion in the third direction DR3 and configured to accommodate the display module DM, the supporter SP, and the digitizer module DTM.

The case CS may include a first case CS1 and a second case CS2, which are arranged in the first direction DR1. The first and second cases CS1 and CS2 may respectively overlap (e.g., may align) with the non-folding areas NFA. The first case CS1 may overlap with the first supporter SP1, and the second case CS2 may overlap with the first supporter SP2.

Figure 8:
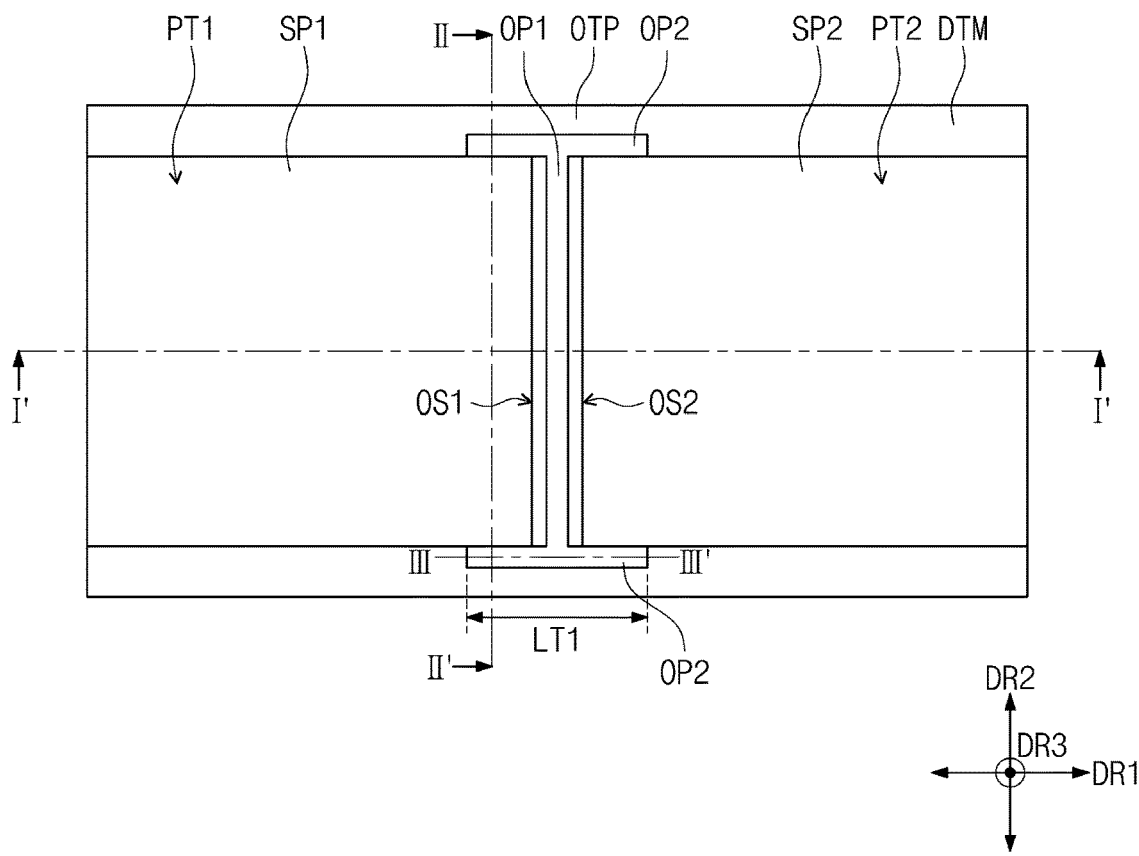
FIG. 8 is a plan view showing a digitizer module of the display device shown in FIG. 7.

FIG. 8 is a plan view (in the third direction DR3 toward the case CS) showing the digitizer module DTM shown in FIG. 7.

For the convenience of explanation, FIG. 8 shows the first and second supporters SP1 and SP2 together with the digitizer module DTM.

Referring to FIG. 8, when viewed in a plan view, the first opening OP1 that extends in the second direction DR2 and a plurality of second openings OP2 that extends in the first direction DR1 from both ends of the first opening OP1 may be defined in the digitizer module DTM.

As an example, two second openings OP2 may extend from both ends of the first opening OP1, respectively, however, this is merely an example, and the number of the second openings OP2 should not be limited to two.

The first and second supporters SP1 and SP2 may be disposed on the digitizer module DTM. The first and second supporters SP1 and SP2 may overlap with a portion of the digitizer module DTM between the second openings OP2.

Each of the first and second supporters SP1 and SP2 may have a quadrangular shape. Each of the first and second supporters SP1 and SP2 may include two sides facing oppositely away from each other in the first direction DR1 and extending in the second direction DR2 and two sides facing oppositely away from each other in the second direction DR2 and extending in the first direction DR1. One of the sides extending in the second direction DR2 of the first supporter SP1 may face (in the first direction DR1) one of the sides extending in the second direction DR2 of the second supporter SP2. Hereinafter, the sides of the first and second supporters SP1 and SP2, which face each other in the first direction DR1, may be referred to as "one side OS1" of the first supporter SP1 and "one side OS2" of the second supporter SP2.

The second openings OP2 may respectively extend along (e.g., may overlap with) predetermined (or set) portions (adjacent to the one side OS1) of both sides of the first supporter SP1 facing oppositely away from each other in the second direction DR2. In addition, the second openings OP2 may respectively extend along (e.g., may overlap with) predetermined (or set) portions (adjacent to the one side OS2) of both sides of the second supporter SP2 facing oppositely away from each other in the second direction DR2.

The digitizer module DTM may include a first portion PT1 and a second portion PT2, which are respectively disposed at left and right sides with respect to the first opening OP1. The first opening OP1 may be defined as a space between the first portion PT1 and the second portion PT2. The first supporter SP1 may overlap with the first portion PT1, and the second supporter SP2 may overlap with the second portion PT2.

The digitizer module DTM may include a plurality of outer portions OTP spaced apart from the first and second portions PT1 and PT2 in the second direction DR2. The outer portions OTP together with the first and second portions PT1 and PT2 may define the second openings OP2. Each of the outer portions OTP may extend from predetermined (or set) portions of the first and second portions PT1 and PT2 without overlapping with the first and second supporters SP1 and SP2. The outer portions OTP may extend in the first direction DR1.

Each of the second openings OP2 may have a first length LT1 with respect to the first direction DR1. The first length LT1 may be substantially a length of each of the outer portions OTP. As used herein, the first portion PT1, the second portion PT2, and the outer portion OTP may refer to distinct elements separated from each other by the first and second openings OP1 and OP2, however, the first portion PT1, the second portion PT2, and the outer portion OTP may be integrally formed with each other.

Figure 9:
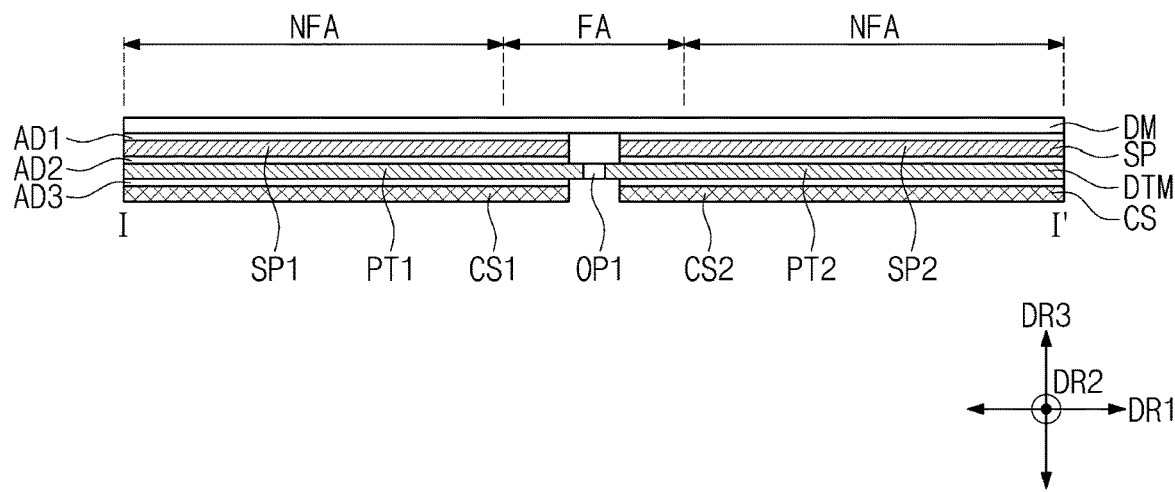
FIG. 9 is a cross-sectional view taken along a line I-I' shown in FIG. 8.

FIG. 9 is a cross-sectional view taken along a line I-I' shown in FIG. 8.

For the convenience of explanation, FIG. 9 shows a state in which the display module DM, the supporter SP, the digitizer module DTM, and the case CS are coupled to each other. Hereinafter, FIGS. 10-12 also show the state in which the display module DM, the supporter SP, the digitizer module DTM, and the case CS are coupled to each other.

Referring to FIG. 9, a first adhesive AD1 may be disposed between the display module DM and the first supporter SP1 and between the display module DM and the second supporter SP2. The display module DM may be attached to the first and second supporters SP1 and SP2 by the first adhesive AD1. As an example, the first adhesive AD1 may be a pressure sensitive adhesive.

The first portion PT1 may be disposed under the first supporter SP1. The second portion PT2 may be disposed under the second supporter SP2 and together with the first portion PT1 may define the first opening OP1. The first opening OP1 may overlap with the folding area FA. In addition, the first opening OP1 may overlap with the space between the first supporter SP1 and the second supporter SP2.

A second adhesive AD2 may be disposed between the first supporter SP1 and the first portion PT1 and between the second supporter SP2 and the second portion PT2. The first and second supporters SP1 and SP2 may be respectively attached to the first and second portions PT1 and PT2 by the second adhesive AD2. As an example, the second adhesive AD2 may be a pressure sensitive adhesive.

The first case CS1 may be disposed under the first portion PT1. The second case CS2 may be disposed under the second portion PT2. A third adhesive AD3 may be disposed between the first portion PT1 and the first case CS1 and between the second portion PT2 and the second case CS2. The first and second portions PT1 and PT2 may be attached to the first and second cases CS1 and CS2, respectively, by the third adhesive AD3.

As an example, the third adhesive AD3 may be a pressure sensitive adhesive. In some embodiments, the third adhesive AD3 may include a heat reactive tape whose adhesive strength drops at a first (set) temperature. For example, the first temperature may be within a range from about 60° C. to about 70° C., and the adhesive strength of the third adhesive AD3 may drop when a heat at the first temperature is applied to the third adhesive AD3 for about 10 minutes. Accordingly, the first and second cases CS1 and CS2 may be easily separated from the first and second portions PT1 and PT2.

When the display device DD is reworked, the case CS may be required to be separated from the display device DD. In the case where the heat reactive tape is used as the third adhesive AD3, the case CS may be easily separated from the display device DD.

In some embodiments, the hinge may be connected to one side of the first case CS1 and one side of the second case CS2, which face each other. The hinge may provide a biaxial rotation axis, which extends in the second direction DR2, to the one side of the first case CS1 and the one side of the second case CS2. The first case CS1 and the second case CS2 may rotate with respect to the rotation axis, and thus the display module DM may be folded.

Figure 10:
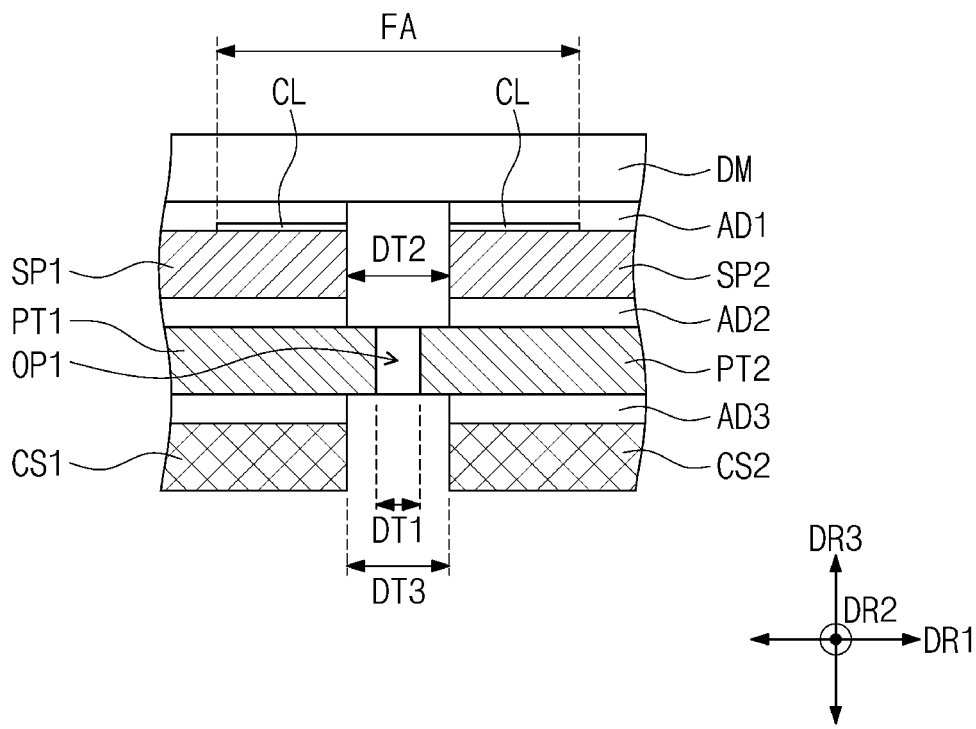
FIG. 10 is an enlarged view showing a folding area shown in FIG. 9.

FIG. 10 is an enlarged view showing a folding area FA shown in FIG. 9.

Referring to FIG. 10, a first distance DT1 in the first direction DR1 between the first portion PT1 and the second portion PT2 may be smaller than a second distance DT2 in the first direction DR1 between the first supporter SP1 and the second supporter SP2. For example, the first distance DT1 may substantially be a width of the first opening OP1 in the first direction DR1. The first distance DT1 between the first portion PT1 and the second portion PT2 may be smaller than a third distance DT3 between the first case CS1 and the second case CS2.

For example, the second distance DT2 may be equal to the third distance DT3, however, it should not be limited thereto or thereby. In some embodiments, the second distance DT2 may be different from the third distance DT3. Each of the first distance DT1, the second distance DT2, and the third distance DT3 may be smaller than a width of the folding area FA in the first direction DR1.

A coating layer CL may be disposed between the first supporter SP1 and the first adhesive AD1 and between the second supporter SP2 and the first adhesive AD1. The coating layer CL may overlap with the folding area FA and may not overlap with the non-folding areas NFA. The coating layer CL may be coated on a region of an upper surface of the first supporter SP1 that overlaps with the folding area FA and a region of an upper surface of the second supporter SP2 that overlaps with the folding area FA.

The coating layer CL may not be attached to the first adhesive AD1. As an example, the coating layer CL may contain fluorine. The coating layer CL may prevent or reduce the first and second supporters SP1 and SP2 from being attached to the first adhesive AD1 in the folding area FA. For the convenience of explanation, the coating layer CL is not shown in FIG. 9 and is shown in FIG. 10 that is the enlarged view.

Figure 11:
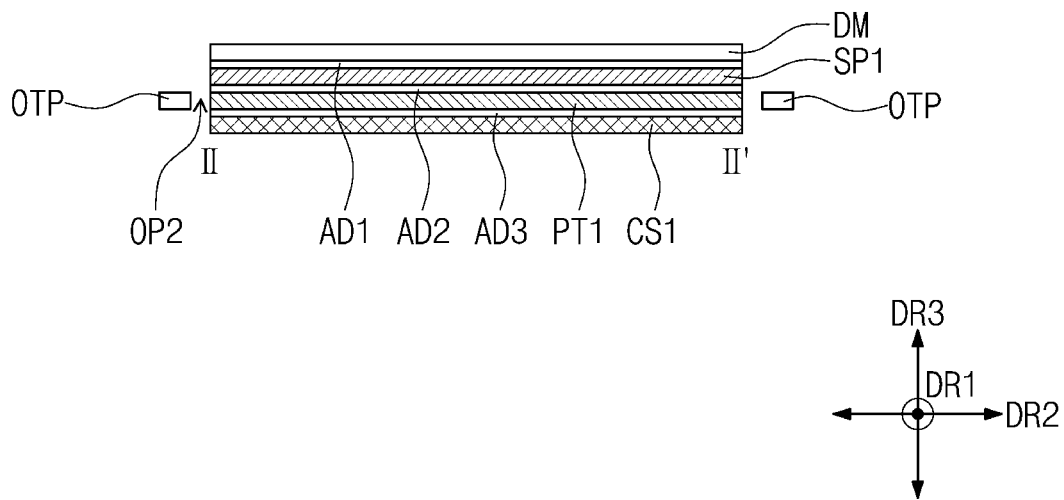
FIG. 11 is a cross-sectional view taken along a line II-II' shown in FIG. 8.

FIG. 11 is a cross-sectional view taken along a line II-II' shown in FIG. 8.

Referring to FIG. 11, a length in the second direction DR2 of the first supporter SP1 may be substantially the same as each of a length of the display module DM and a length of the first portion PT1 between the second openings OP2. A length in the second direction DR2 of the second supporter SP2 may be substantially the same as a length of the second portion PT2, however, it should not be limited thereto or thereby. The length in the second direction DR2 of each of the first and second supporters SP1 and SP2 may be smaller than the length in the second direction DR2 of each of the first and second portions PT1 and PT2.

The outer portions OTP may be respectively disposed on the outer side (e.g., outside) of the two sides of the first supporter SP1 that face oppositely away from each other in the second direction DR2. The outer portions OTP may also be disposed on the outer side (e.g., outside) of the two sides of the second supporter SP2 that face oppositely away from each other in the second direction DR2.

The outer portions OTP may be spaced apart from the first portion PT1, and the second openings OP2 may be defined between the outer portions OTP and the first portion PT1. The outer portions OTP may be spaced apart from the second portion PT2, and the second openings OP2 may be defined between the outer portions OTP and the second portion PT2.

Figure 12:
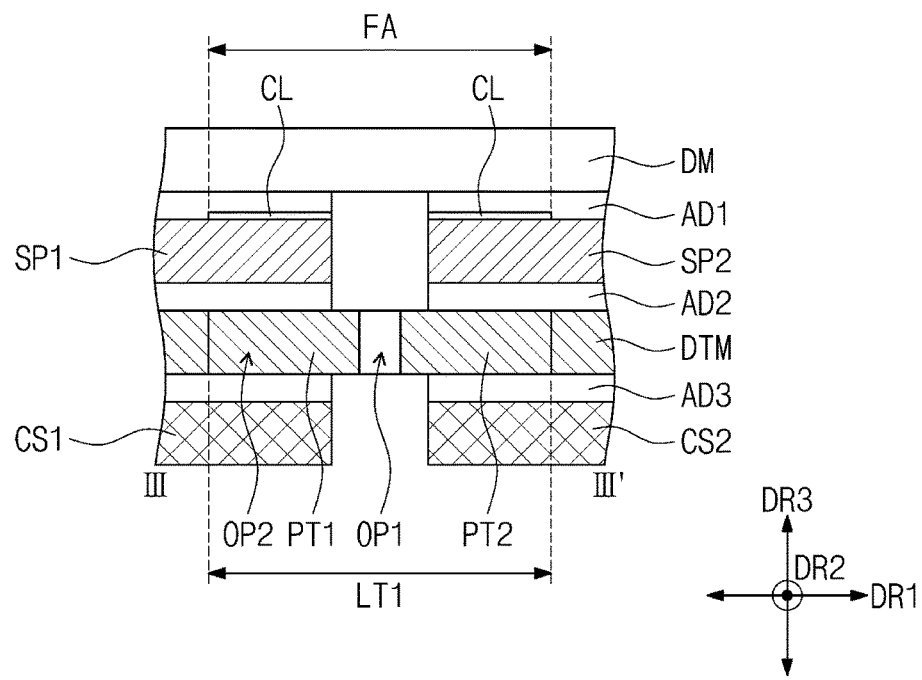
FIG. 12 is a cross-sectional view taken along a line III-Ill' shown in FIG. 8.
Figure 13:
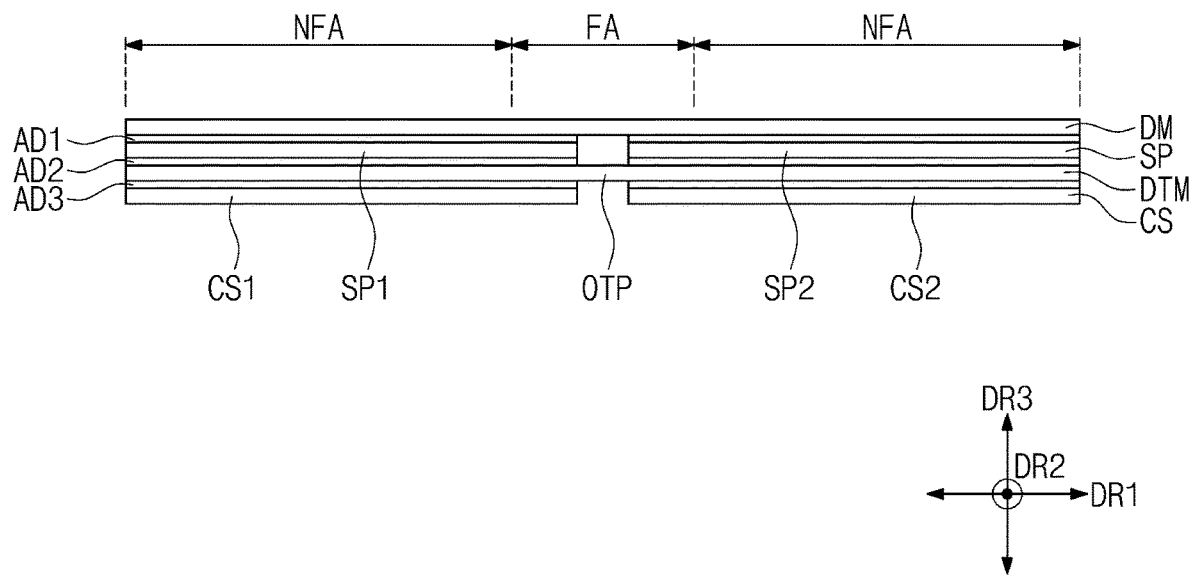
FIGS. 13-16 are views explaining a folding operation of a display device according to an example embodiment of the present disclosure.
Figure 14:
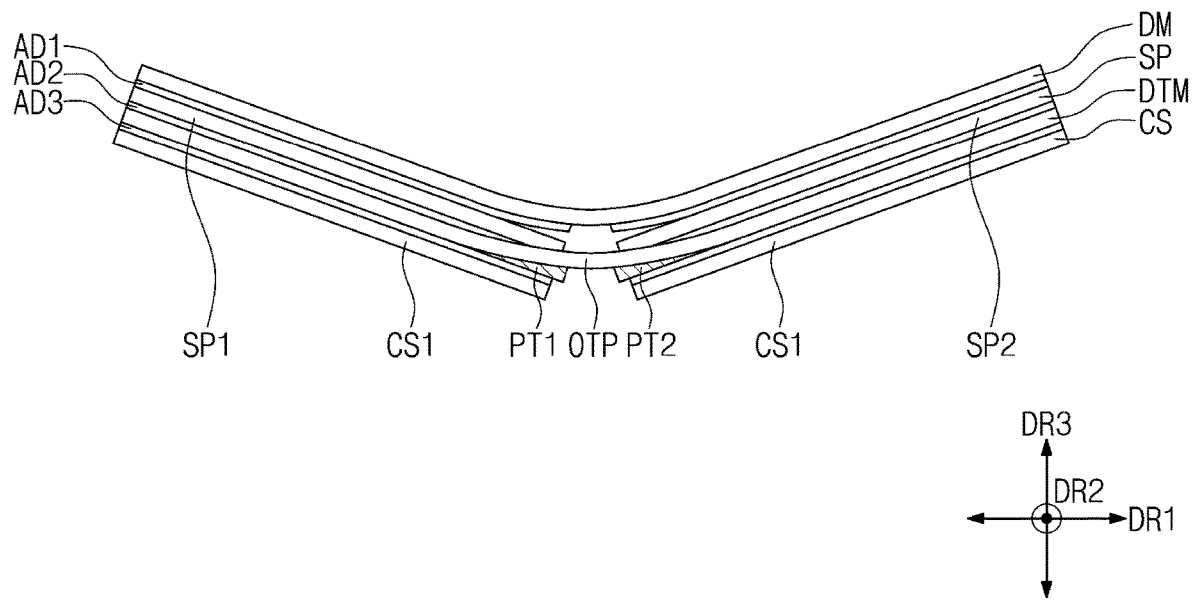
Figure 15:
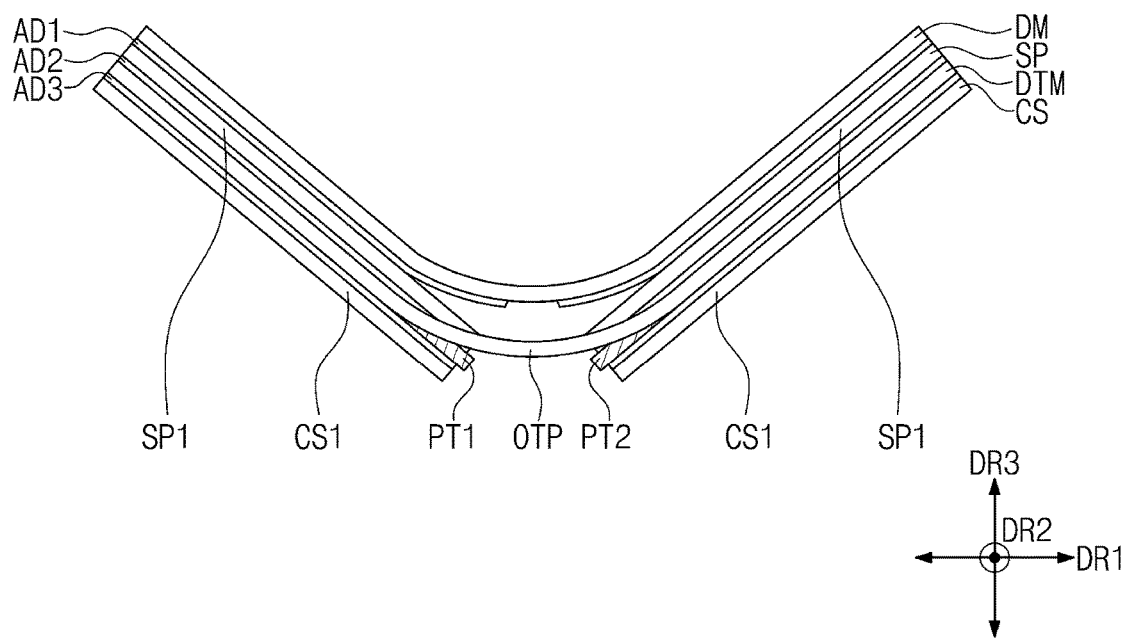
Figure 16:
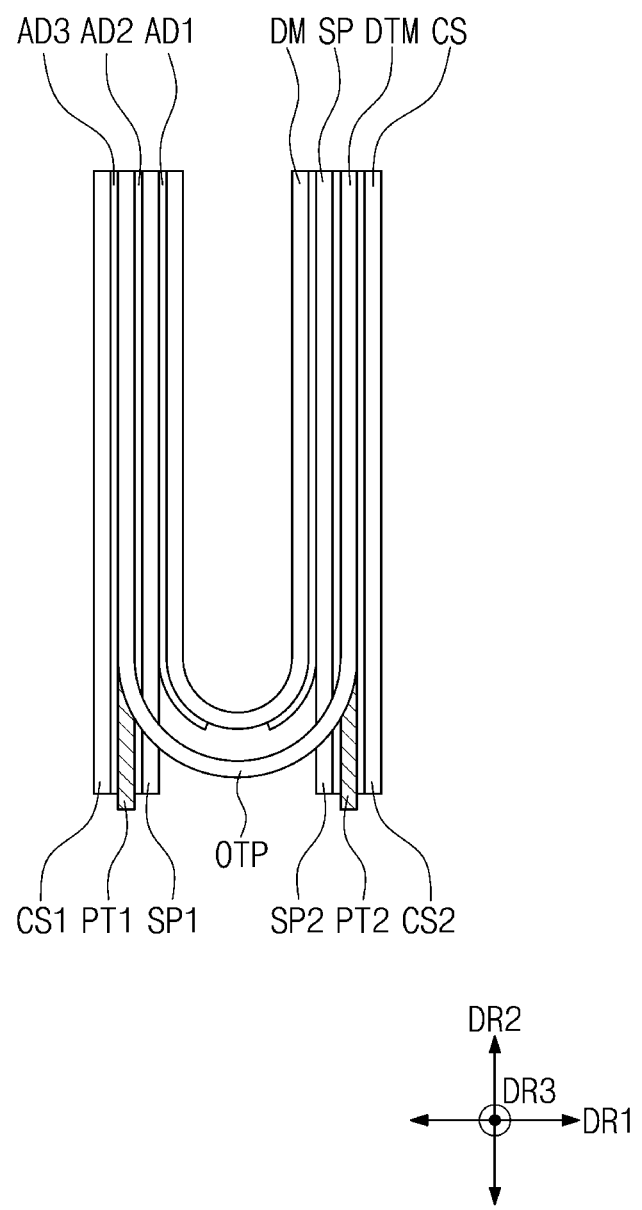

FIG. 12 is a cross-sectional view taken along a line III-III' shown in FIG. 8.

Referring to FIG. 12, a first length LT1 in the first direction DR1 of the second opening OP2 may be substantially the same as the length in the first direction DR1 of the folding area FA. Accordingly, a length of each of the outer portions OTP may be substantially the same as the width of the folding area FA. In some embodiments, a first length LT1 of the second opening OP2 may be greater than the first distance DT1 defined as the width of the first opening OP1.

FIGS. 13-16 are views explaining a folding operation of the display device DD according to an example embodiment of the present disclosure.

For the convenience of explanation, FIGS. 13-16 show a side surface of the display device DD when viewed in the second direction DR2.

Referring to FIGS. 13-16, the display device DD in a flat state may be folded by the first case CS1 and the second case CS2. As an example, the first case CS1 may rotate in a clockwise direction with respect to one side of the first case CS1, and the second case CS2 may rotate in a counter-clockwise direction with respect to one side of the second case CS2. Therefore, the folding area FA may be curved downward convex, so that the display module DM may be folded. The display module DM may be inwardly folded (in-folding) not to be exposed to the outside.

When the first and second cases CS1 and CS2 move, the first and second portions PT1 and PT2 attached to the first and second cases CS1 and CS2 move, and thus the first and second supporters SP1 and SP2 attached to the first and second portions PT1 and PT2 may move. In addition, the non-folding areas NFA of the display module DM attached to the first and second supporters SP1 and SP2 may move. The first and second portions PT1 and PT2 may be maintained in the flat state with the first and second supporters SP1 and SP2 while moving.

Portions of the first and second supporters SP1 and SP2, which overlap with the folding area FA, may not be attached to the above-mentioned first adhesive AD1 due the coating layer CL between the first and second supporters SP1 and SP2 and the first adhesive AD1. Accordingly, when the display module DM is folded, the portions of the first and second supporters SP1 and SP2, which overlap with the folding area FA, may be separated from the display module DM.

Since the display module DM is a flexible display module, the folding area FA may be easily curved. However, each of the first and second supporters SP1 and SP2 is a rigid type (e.g., is made from a rigid material), and thus the first and second supporters SP1 and SP2 may not be curved. When the portions of the first and second supporters SP1 and SP2, which overlap with the folding area FA, are attached to the folding area FA, it is difficult for the display module DM to be folded due to the first and second supporters SP1 and SP2.

In the example embodiment of the present disclosure, because the portions of the first and second supporters SP1 and SP2, which overlap with the folding area FA, are not attached to the display module DM, the folding area FA may be easily curved.

The outer portion OTP may be folded together with the folding area FA when the display module DM is folded. The outer portion OTP may be deformed to have a shape that is curved downward convex. The first and second portions PT1 and PT2 are separated from each other by the first opening OP1, however, regions of the first portion PT1 may be connected to regions of the second portion PT2 through the outer portion OTP.

In a comparable device, a digitizer module in which the first and second openings OP1 and OP2 are not defined may be attached to the lower portion of the display module DM, and the supporter SP may be disposed on the lower portion of the digitizer module. When the display module is folded, a stress may occur in the folding portion of the digitizer module, and as a result, a wiring line pattern (or electrode pattern) disposed in the folding portion may be damaged.

In addition, a curved surface may be formed on a surface of the digitizer module (e.g., flatness degradation) due to the wiring line pattern of the digitizer module. In this case, since the image generated in the display module DM may be perceived by the user as a curved shape due to the influence of the curved surface of the digitizer module, a display quality may be deteriorated.

In the example embodiment of the present disclosure, when the display device is folded, the first portion PT1 and the second portion PT2 may be maintained in the flat state while moving, due to the first opening OP1. Thus, the first portion PT1 and the second portion PT2, which overlap with the folding area FA, may be maintained in the flat state without being curved. Accordingly, the folding portion may not be formed in the digitizer module DTM, and thus the wiring line pattern of the digitizer module DTM may not be damaged.

In the example embodiment of the present disclosure, since the digitizer module DTM is disposed under the relatively rigid first and second supporters SP1 and SP2, the curved surface of the digitizer module DTM may not exert an influence on the display module DM. Accordingly, the display quality may be prevented or protected from being deteriorated.

Although the first portion PT1 and the second portion PT2 are separated from each other by the first opening OP1, the wiring line pattern of the first portion PT1 may be connected to the wiring line pattern of the second portion PT2 through the outer portion OTP. Therefore, the first portion PT1 and the second portion PT2 may operate normally.

Consequently, the display device DD according to the example embodiment of the present disclosure may prevent or protect the digitizer module DTM from being damaged due to the folding operation and may prevent or reduce the deterioration of the display quality due to the curved surface of the digitizer module DTM.

FIGS. 17-24 are views showing configurations of digitizer modules DTM_1 to DTM_5 according to various embodiments of the present disclosure.

Hereinafter, different configurations of the digitizer modules DTM_1 to DTM_5 from those of the digitizer module DTM shown in FIG. 8 will be mainly described with reference to FIGS. 17-24. The same configurations (elements) will be assigned with the same reference numerals, and duplicative descriptions thereof will not be provided. Depending on the needs of the explanation, the display module DM, the supporter SP, and the case CS are omitted or included in FIGS. 17-24.

Figure 17:
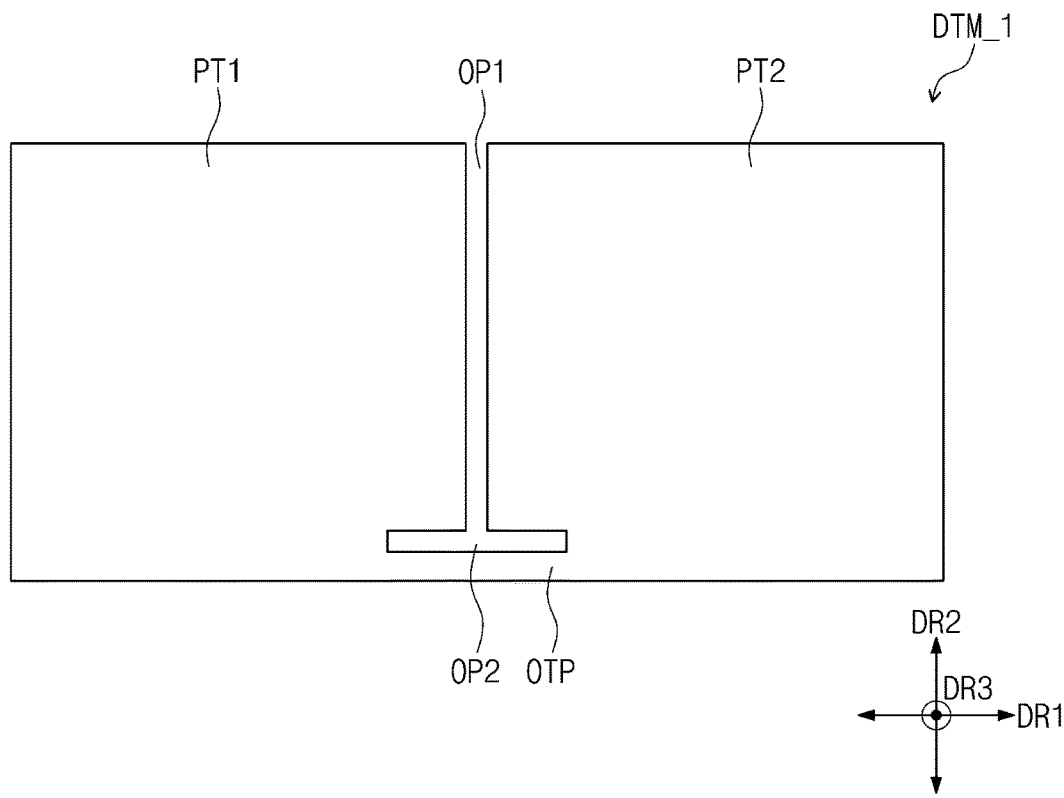
FIG. 17 is a plan view showing a digitizer module according to another embodiment of the present disclosure.

FIG. 17 is a plan view showing the digitizer module DTM_1 according to another embodiment of the present disclosure.

Referring to FIG. 17, a first opening OP1 that extends in the second direction DR2 and a second opening OP2 that extends in the first direction DR1 from one end of the first opening OP1 may be defined in the digitizer module DTM_1. The first opening OP1 may be defined between a first portion PT1 and a second portion PT2, and the second opening OP2 may be defined between the outer portion OTP and the first and second portions PT1 and PT2.

The digitizer module DTM_1 may have the same configuration as that of the digitizer module DTM shown in FIG. 8 except that only one second opening OP2 is defined.

Figure 18:
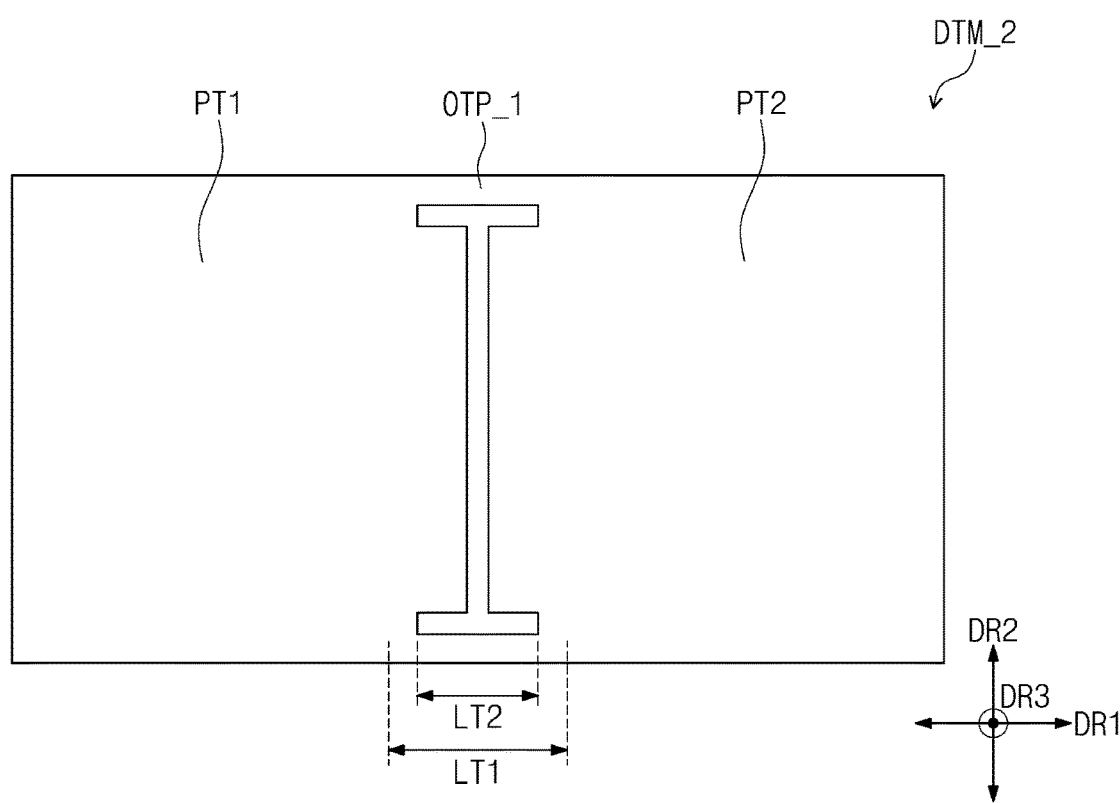
FIG. 18 is a plan view showing a digitizer module according to another embodiment of the present disclosure.
Figure 19:
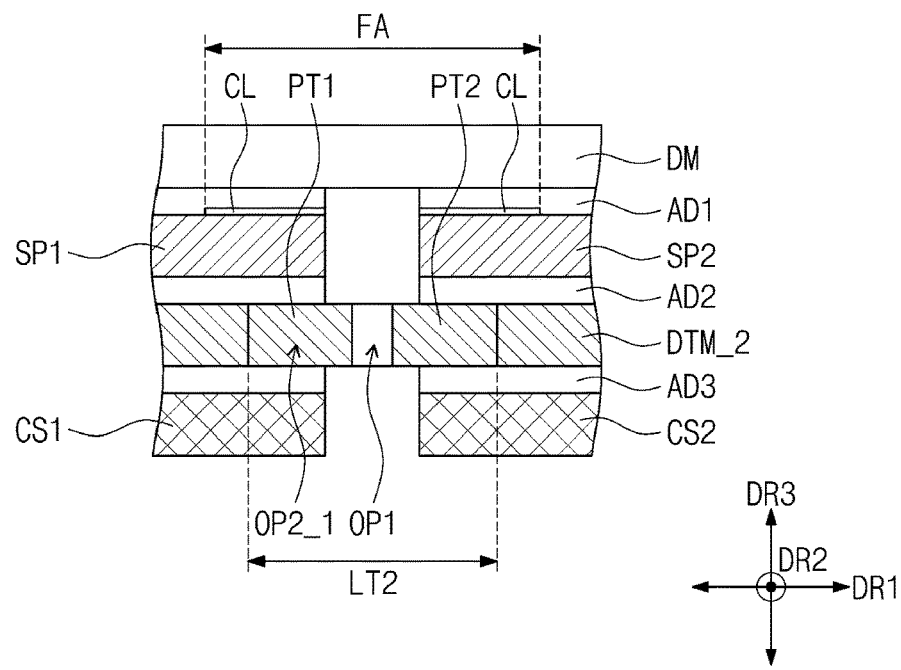
FIG. 19 is a cross-sectional view showing a cross section of the digitizer module shown in FIG. 18.

FIG. 18 is a plan view showing the digitizer module DTM_2 according to another embodiment of the present disclosure. FIG. 19 is a cross-sectional view showing a cross section of the digitizer module DTM_2 shown in FIG. 18.

For the convenience of explanation, FIG. 19 shows the cross section of the same portion of the device as the one shown in FIG. 12.

Referring to FIGS. 18 and 19, a second length LT2 in the first direction DR1 of a second opening OP2_1 defined in the digitizer module DTM_2 may be smaller than a length in the first direction DR1 of a folding area FA. The second length LT2 of the second opening OP2_1 may be smaller than the first length LT1 of the second opening OP2 shown in FIG. 8.

Accordingly, an outer portion OTP_1 of the digitizer module DTM_2 may have a length smaller than the length of the outer portion OTP of the digitizer module DTM shown in FIG. 8. Other configurations of the digitizer module DTM_2 may be substantially the same as those of the digitizer module DTM shown in FIG. 8.

Figure 20:
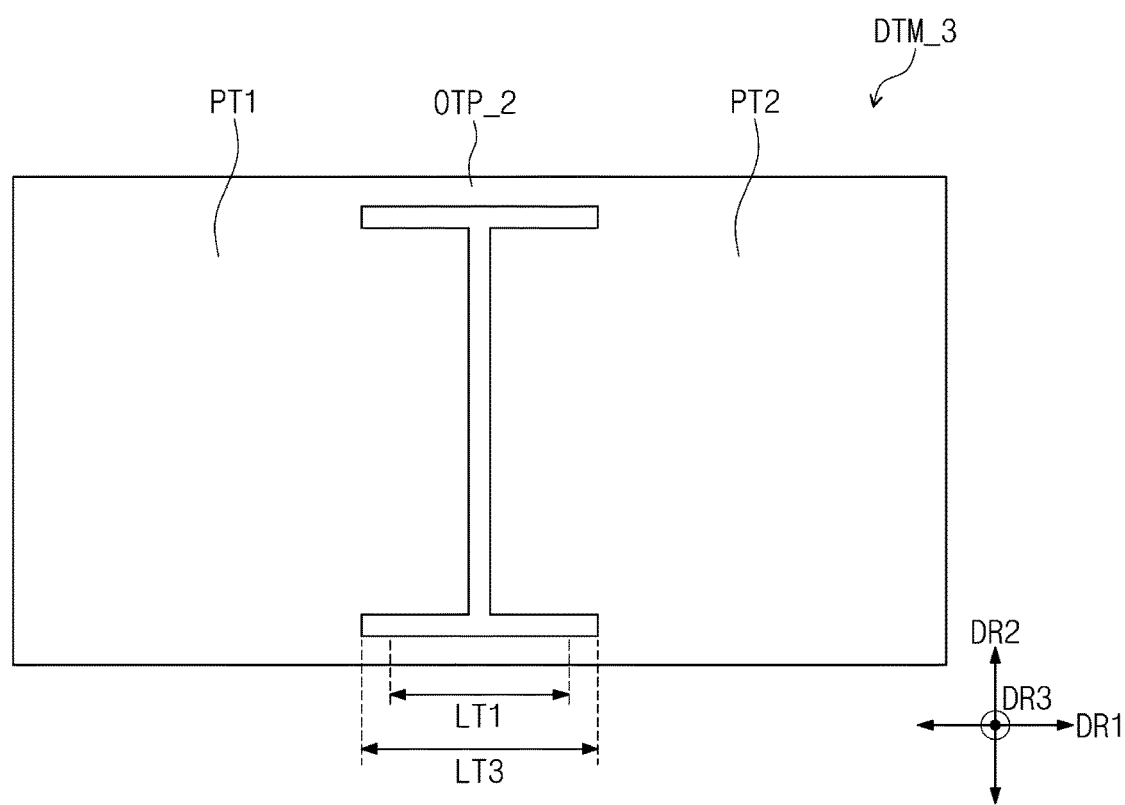
FIG. 20 is a plan view showing a digitizer module according to another embodiment of the present disclosure.
Figure 21:
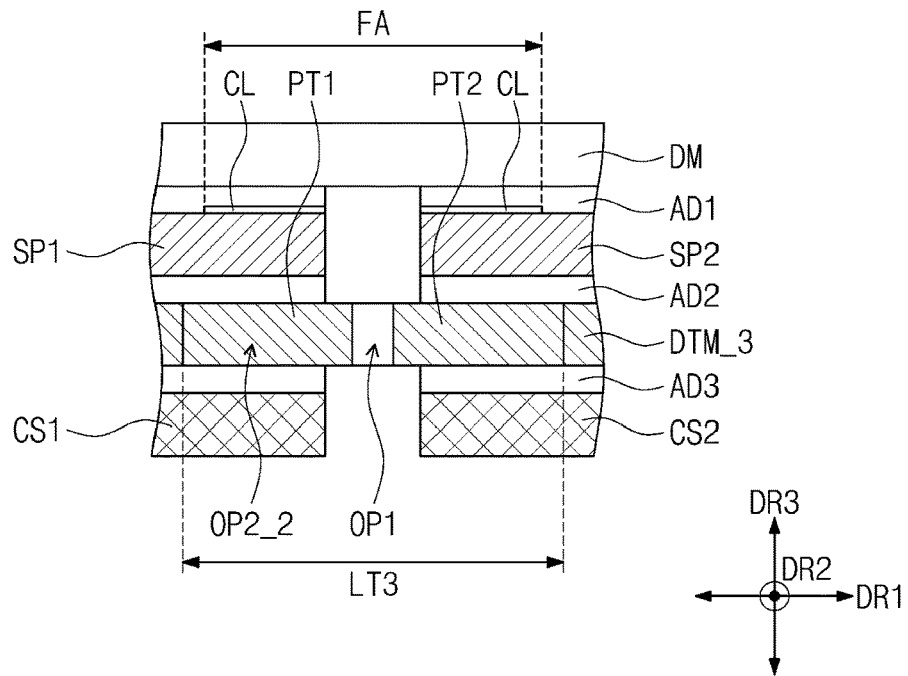
FIG. 21 is a cross-sectional view showing a cross section of the digitizer module shown in FIG. 20.

FIG. 20 is a plan view showing the digitizer module DTM_3 according to another embodiment of the present disclosure. FIG. 21 is a cross-sectional view showing a cross section of the digitizer module DTM_3 shown in FIG. 20.

For the convenience of explanation, FIG. 21 shows the cross section of the same portion of the device as the one shown in FIG. 12.

Referring to FIGS. 20 and 21, a third length LT3 in the first direction DR1 of a second opening OP2_2 defined in the digitizer module DTM_3 may be larger than a length in the first direction DR1 of a folding area FA. The third length LT3 of the second opening OP2_2 may be larger than the first length LT1 of the second opening OP2 shown in FIG. 8.

Accordingly, an outer portion OTP_2 of the digitizer module DTM_3 may have a length larger than the length of the outer portion OTP of the digitizer module DTM shown in FIG. 8. Other configurations of the digitizer module DTM_3 may be substantially the same as those of the digitizer module DTM shown in FIG. 8.

Figure 22:
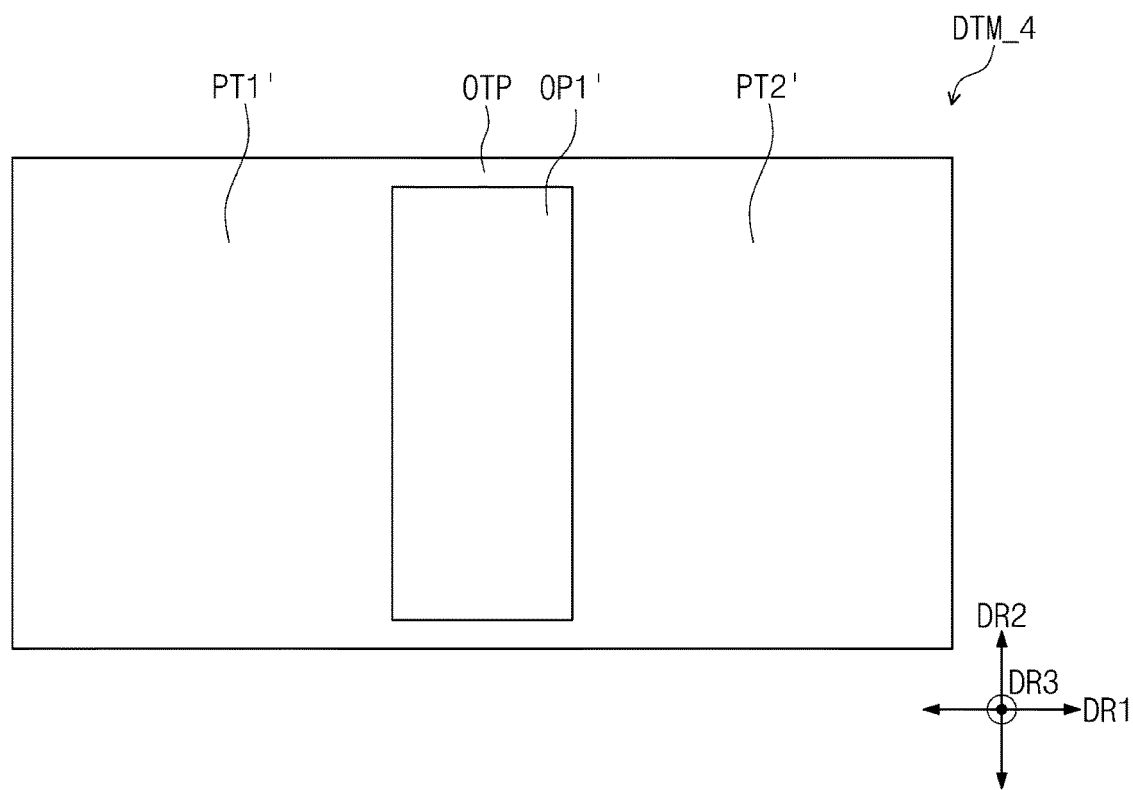
FIG. 22 is a plan view showing a digitizer module according to another embodiment of the present disclosure.
Figure 23:
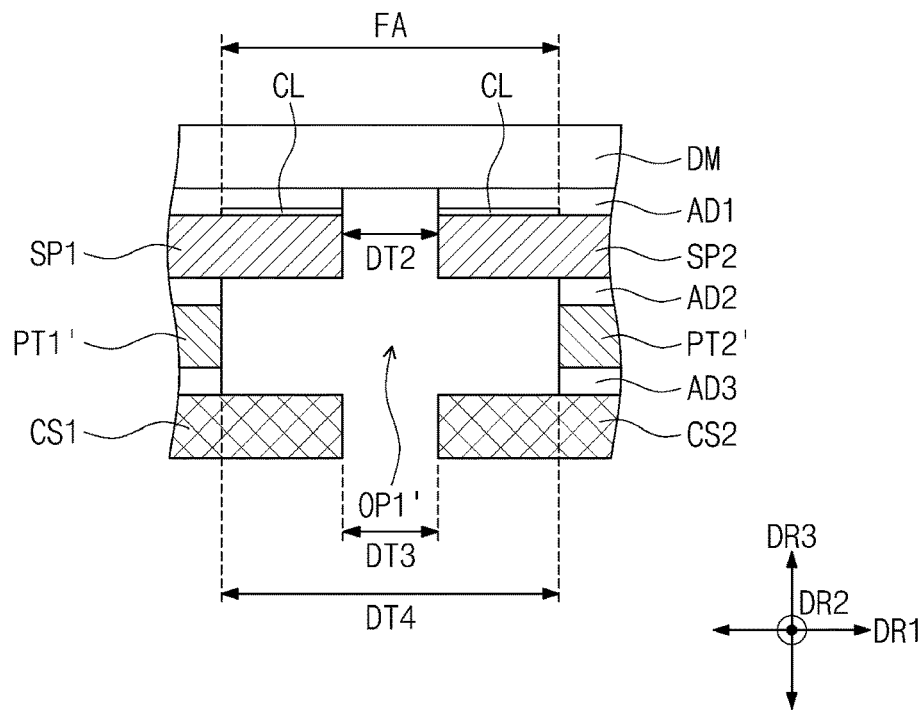
FIG. 23 is a cross-sectional view showing a cross section of the digitizer module shown in FIG. 20.

FIG. 22 is a plan view showing the digitizer module DTM_4 according to another embodiment of the present disclosure. FIG. 23 is a cross-sectional view showing a cross section of the digitizer module DTM_4 shown in FIG. 20.

For the convenience of explanation, FIG. 23 shows the cross section of the same portion of the device as the one shown in FIG. 12.

Referring to FIGS. 22 and 23, a first opening OP1' extending in the second direction DR2 may be defined in the digitizer module DTM_4. The first opening OP1' may be defined by first and second portions PT1' and PT2' and outer portions OTP. As an example, the first opening OP1' may be defined (may be located) between the first portion PT1' and the second portion PT2' and between the outer portions OTP.

The first opening OP1' may overlap with a folding area FA. A fourth distance DT4 in the first direction DR1 between the first portion PT1' and the second portion PT2' may be substantially the same as a length in the first direction DR1 of the folding area FA. That is, a length in the first direction DR1 of the first opening OP1' may be substantially the same as the length in the first direction DR1 of the folding area FA.

The fourth distance DT4 may be larger than a second distance DT2 between a first supporter SP1 and a second supporter SP2, and larger than a third distance DT3 between a first case CS1 and a second case CS2.

Figure 24:
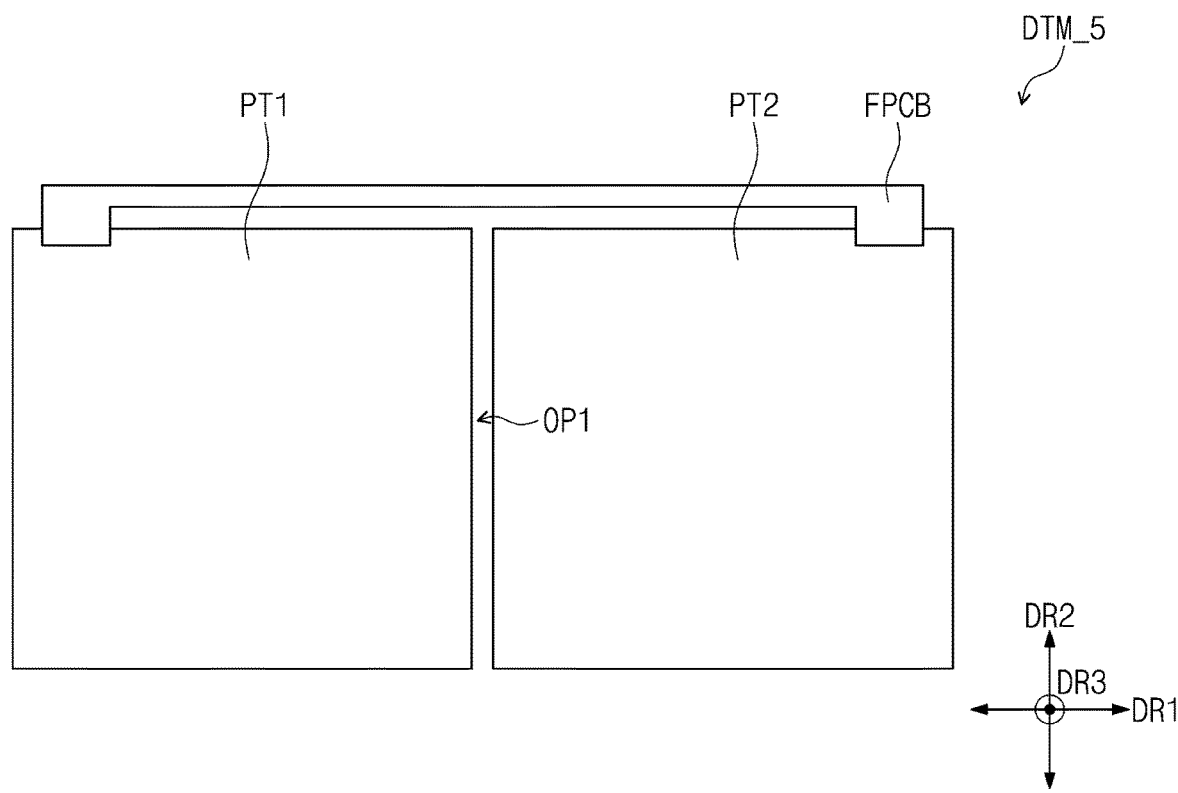
FIG. 24 is a plan view showing a digitizer module according to another embodiment of the present disclosure.

FIG. 24 is a plan view showing the digitizer module DTM_5 according to another embodiment of the present disclosure.

Referring to FIG. 24, the digitizer module DTM_5 may include a first portion PT1 and a second portion PT2, and a first opening OP1 may be defined between the first portion PT1 and the second portion PT2. The first portion PT1 and the second portion PT2 may be connected to each other by a flexible printed circuit board FPCB.

The digitizer module DTM shown in FIG. 8 differs from the digitizer module DTM_5 shown in FIG. 24 in that the latter does not include outer portions OTP, and the first portion PT1 and the second portion PT2 may be separated (e.g., entirely separated) from each other. Accordingly, the flexible printed circuit board FPCB may be used to connect the first portion PT1 to the second portion PT2.

The flexible printed circuit board FPCB may be connected (coupled) to one side of the two sides of the first portion PT1 facing oppositely away from each other in the second direction DR2, and may extend in the first direction DR1. The flexible printed circuit board FPCB extending in the first direction DR1 may be connected (coupled) to one side among the two sides of the second portion PT2 facing oppositely away from each other in the second direction DR2.

Figure 25:
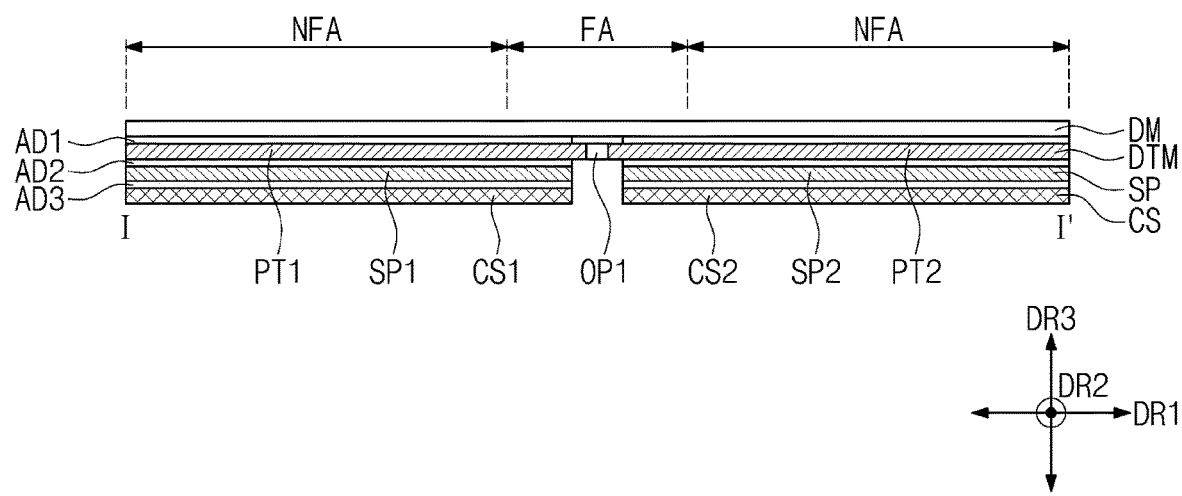
FIG. 25 is a cross-sectional view showing a configuration of the digitizer module according to another embodiment of the present disclosure.

FIG. 25 is a cross-sectional view showing a configuration of the digitizer module according to another embodiment of the present disclosure.

For the convenience of explanation, FIG. 25 shows a cross section of the same portion of the device as the one shown in FIG. 9.

Referring to FIG. 25, a digitizer module DTM may be disposed under a display module DM. A supporter SP may be disposed under the digitizer module DTM. The digitizer module DTM may have substantially the same structure as that of the digitizer module DTM shown in FIGS. 8 and 9.

When the digitizer module DTM is disposed under the display module DM, the cushion layer CSL (shown in FIG. 3) of the display module DM may have a thickness equal to or greater than about 100 micrometers (μm). In some embodiments, the cushion layer CSL may have the thickness from about 100 micrometers (μm) to about 150 micrometers (μm). Other configurations of the digitizer module DTM may be substantially the same as those shown in FIG. 9. In some embodiments, the coating layer CL described in FIG. 10 may be coated on an upper surface of the digitizer module DTM.

As the cushion layer CSL becomes thick, a distortion of the image due to the curved surface of the digitizer module DTM may be reduced. For example, in the case where the cushion layer CSL has the thickness equal to or greater than about 100 micrometers (μm), the curved surface of the digitizer module DTM may not exert an influence (or may exert a reduced influence) on the image of the display module DM.

Figure 26:
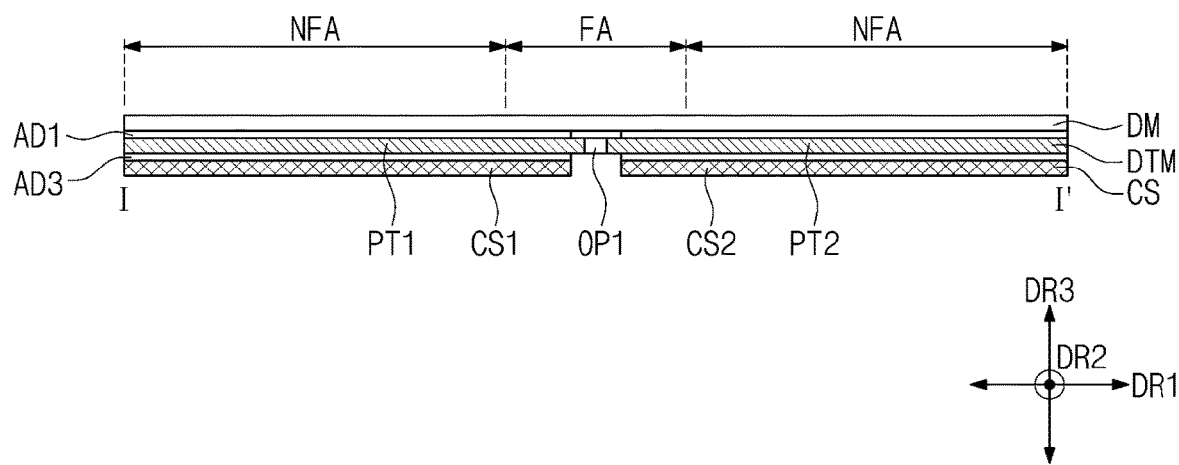
FIG. 26 is a cross-sectional view showing a configuration of the digitizer module according to another embodiment of the present disclosure.

FIG. 26 is a cross-sectional view showing a configuration of the digitizer module according to another embodiment of the present disclosure.

For the convenience of explanation, FIG. 26 shows a cross section of the same portion of the device as the one shown in FIG. 9.

Referring to FIG. 26, a supporter SP may not be disposed under the display module DM, and a digitizer module DTM may be disposed under the display module DM. The configuration shown in FIG. 9 differs from the one shown in FIG. 26 in that the supporter SP is omitted in FIG. 26. The structure of the digitizer module DTM may be substantially the same as that of the digitizer module DTM shown in FIGS. 8 and 9. A cushion layer CSL of the display module DM may have a thickness from about 100 micrometers (μm) to about 150 micrometers (μm). Other configurations of the digitizer module DTM may be substantially the same as those shown in FIG. 9.

The digitizer module DTM may substantially act as the supporter SP. As an example, the digitizer module DTM may have a thickness that is enough to support the display module DM. In the example embodiment of the present disclosure, the digitizer module DTM may have the thickness equal to or greater than about 70 micrometers (μm), and in some embodiments, may have the thickness from about 70 micrometers (μm) to about 100 micrometers (μm).

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present invention have been described, it is understood that the present invention should not be limited to these example embodiments, but various changes and modifications can be made by one ordinary skilled in the art within the spirit and scope of the present invention as defined by the appended claims and equivalents thereof. Therefore, the disclosed subject matter should not be limited to any single embodiment described herein, and the scope of the present inventive concept shall be determined according to the attached claims and their equivalents.

What is claimed is:

1. A display device comprising:
    a display module;
    a first supporter under the display module;
    a second supporter under the display module, the first and second supporters being arranged with each other in a first direction with a space therebetween; and
    a digitizer module under the first and second supporters and having a first opening defined therethrough and extending in a second direction crossing the first direction and second openings defined therethrough and respectively extending along the first direction from both ends of the first opening,
    wherein the first opening overlaps the space between the first supporter and the second supporter.

2. The display device of claim 1, wherein each of the first and second supporters comprises a pair of first sides facing oppositely away from each other in the first direction and a pair of second sides facing oppositely away from each other in the second direction,
    wherein one first side of the first supporter and one first side of the second supporter face each other in the first direction, and
    the second openings extend along portions of the second sides of the first supporter adjacent to the one first side of the first supporter, and portions of the second sides of the second supporter adjacent to the one first side of the second supporter.

3. The display device of claim 1, wherein the display module comprises:
non-folding areas arranged in the first direction; and
a folding area between two adjacent non-folding areas,
wherein the first and second supporters are under the two adjacent non-folding areas, respectively.

4. The display device of claim 3, wherein a length in the first direction of each of the second openings is equal to a length in the first direction of the folding area.

5. The display device of claim 3, wherein the digitizer module comprises:
a first portion under the first supporter;
a second portion under the second supporter, the first and second portions defining the first opening; and
a plurality of outer portions spaced apart from the first and second portions along the second direction, the first portion, the second portion, and the respective outer portion of the plurality of outer portions defining the respective second opening.

6. The display device of claim 5, wherein each of the plurality of outer portions extends from the first and second portions and does not overlap with the first and second supporters.

7. The display device of claim 5, wherein a length in the second direction of each of the first and second supporters is equal to a length in the second direction of each of the first and second portions.

8. The display device of claim 5, wherein a distance in the first direction between the first portion and the second portion is smaller than a distance in the first direction between the first supporter and the second supporter.

9. The display device of claim 8, wherein the distance in the first direction between the first supporter and the second supporter is smaller than a length in the first direction of the folding area.

10. The display device of claim 5, further comprising:
a first adhesive between the display module and the first and second supporters; and
a coating layer between the first adhesive and the first and second supporters, the coating layer overlapping the folding area.

11. The display device of claim 10, wherein the coating layer comprises fluorine and is not attached to the first adhesive.

12. The display device of claim 5, further comprising a second adhesive between the first supporter and the first portion and between the second supporter and the second portion.

13. The display device of claim 5, further comprising:
a first case under the first portion; and
a second case under the second portion.

14. The display device of claim 13, wherein the display module is configured to be inwardly folded by the first and second cases such that a display surface of the display module is not exposed to an outside.

15. The display device of claim 13, further comprising a third adhesive between the first portion and the first case and between the second portion and the second case.

16. The display device of claim 15, wherein the third adhesive comprises a heat reactive tape whose adhesive strength is configured to drop at a first temperature.

17. The display device of claim 3, wherein a length in the first direction of each of the second openings is smaller than a width in the first direction of the folding area.

18. The display device of claim 3, wherein a length in the first direction of each of the second openings is larger than a width in the first direction of the folding area.

19. The display device of claim 3, wherein a width in the first direction of the first opening is equal to a width in the first direction of the folding area.

20. The display device of claim 1, wherein the display module comprises:
a touch sensing unit;
a display panel under the touch sensing unit;
a protective substrate under the display panel; and
a cushion layer under the protective substrate.

21. A display device comprising:
a display module;
a first supporter under the display module;
a second supporter under the display module, the first and second supporters being arranged with each other in a first direction with a space therebetween; and
a digitizer module under the first and second supporters and having a first opening defined therethrough, the first opening extending in a second direction crossing the first direction and overlapping the space between the first supporter and the second supporter,
wherein the digitizer module comprises:
a first portion under the first supporter; and
a second portion under the second supporter, the first and second portions defining the first opening,
wherein a distance in the first direction between the first portion and the second portion is smaller than a distance in the first direction between the first supporter and the second supporter.

22. The display device of claim 21, further comprising a flexible printed circuit board that connects the first portion to the second portion.

23. The display device of claim 22, wherein each of the first and second portions comprises a pair of first sides facing oppositely away from each other in the first direction and a pair of second sides facing oppositely away from each other in the second direction,
the flexible printed circuit board extends in the first direction and is connected to one second side of the first portion, and one second side of the second portion.

24. The display device of claim 21, wherein the digitizer module comprises a second opening extending along the first direction from one end of the first opening.

25. The display device of claim 21, wherein the digitizer module further comprises second openings respectively extending along the first direction from both ends of the first opening, and
wherein each of the first and second supporters comprises a pair of first sides facing oppositely away from each other in the first direction and a pair of second sides facing oppositely away from each other in the second direction, one first side of the first supporter and one first side of the second supporter facing each other in the first direction, and
the second openings extend along:
portions of the second sides of the first supporter adjacent to the one first side of the first supporter, and
portions of the second sides of the second supporter adjacent to the one first side of the second supporter.

26. The display device of claim 25, wherein the digitizer module further comprises a plurality of outer portions spaced apart from the first and second portions along the second direction, the first portion, the second portion, and the respective outer portion of the plurality of outer portions defining the respective second opening.

27. A display device comprising:
a display module comprising non-folding areas arranged with each other in a first direction and a folding area between two adjacent non-folding areas; and
a digitizer module under the display module and comprising a first opening defined therethrough and extending in a second direction crossing the first direction and second openings defined therethrough and respectively extending along the first direction from both ends of the first opening,
wherein the first opening overlaps the folding area, and
wherein the first and second openings are integrally formed and defined within a boundary of the digitizer module.

28. The display device of claim 27, wherein the display module comprises:
a display panel;
a protective substrate under the display panel; and
a cushion layer under the protective substrate,
wherein the cushion layer has a thickness from about 100 micrometers to about 150 micrometers, and the digitizer module has a thickness from about 70 micrometers to about 100 micrometers.

29. The display device of claim 27, further comprising a first supporter and a second supporter, which respectively overlap the two adjacent non-folding areas, the first and second supporters being under the digitizer module,
wherein the digitizer module comprises:
a first portion under the first supporter;
a second portion under the second supporter, the first and second portions defining the first opening; and
an outer portion spaced apart from the first and second portions in the second direction, the first portion, the second portion, and the outer portion defining the second openings, and the outer portion does not overlap with the first and second supporters.

* * * * *